(12) United States Patent
Satoh

(10) Patent No.: US 12,457,800 B2
(45) Date of Patent: Oct. 28, 2025

(54) SEMICONDUCTOR DEVICE, POWER CONVERSION APPARATUS, AND METHOD FOR DRIVING SEMICONDUCTOR DEVICE

(71) Applicant: Mitsubishi Electric Corporation, Tokyo (JP)

(72) Inventor: Katsumi Satoh, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 535 days.

(21) Appl. No.: 17/814,432

(22) Filed: Jul. 22, 2022

(65) Prior Publication Data

US 2023/0147438 A1 May 11, 2023

(30) Foreign Application Priority Data

Nov. 9, 2021 (JP) .................................. 2021-182492

(51) Int. Cl.
*H10D 84/83* (2025.01)
*H02M 1/08* (2006.01)
(Continued)

(52) U.S. Cl.
CPC .............. *H10D 84/83* (2025.01); *H02M 1/08* (2013.01); *H02M 7/537* (2013.01);
(Continued)

(58) Field of Classification Search
CPC .... H10D 12/01; H10D 12/031; H10D 12/032; H10D 12/035; H10D 12/038;
(Continued)

(56) References Cited

U.S. PATENT DOCUMENTS

2012/0286288 A1 11/2012 Hussein et al.
2013/0134521 A1 5/2013 Misumi
(Continued)

FOREIGN PATENT DOCUMENTS

EP  3 952 082 A1  2/2022
JP  2012-238715 A  12/2012
(Continued)

OTHER PUBLICATIONS

An Office Action; "Notice of Reasons for Refusal," mailed by the Japanese Patent Office on Jul. 23, 2024, which corresponds to Japanese Patent Application No. 2021-182492 and is related to U.S. Appl. No. 17/814,432; with English language translation.
(Continued)

*Primary Examiner* — Jeff W Natalini
*Assistant Examiner* — Andrew Zabel
(74) *Attorney, Agent, or Firm* — Studebaker Brackett PLLC

(57) ABSTRACT

A semiconductor device includes a layer structure including a first gate electrode and a second gate electrode, and a first main electrode and a second main electrode that can be electrically connected through the layer structure. The threshold voltage of the second gate electrode is higher than the threshold voltage of the first gate electrode. In the α state and the β condition, the switching operation is performed using the first gate electrode, and in the γ state or the δ condition, the switching operation is performed using the second gate electrode.

13 Claims, 7 Drawing Sheets

(51) Int. Cl.
H02M 7/537 (2006.01)
H10D 12/00 (2025.01)
H10D 64/27 (2025.01)

(52) U.S. Cl.
CPC ......... H10D 12/481 (2025.01); H10D 64/514 (2025.01); H10D 64/518 (2025.01)

(58) Field of Classification Search
CPC .. H10D 12/411; H10D 12/415; H10D 12/416; H10D 12/417; H10D 12/418; H10D 12/421; H10D 12/441; H10D 12/461; H10D 12/481; H10D 12/491; H10D 12/4218; H10D 84/161; H10D 62/142; H10D 62/14; H10D 18/221
See application file for complete search history.

(56) References Cited

U.S. PATENT DOCUMENTS

| | | | |
|---|---|---|---|
| 2015/0123165 A1 | 5/2015 | Omura et al. | |
| 2016/0099188 A1* | 4/2016 | Jaeger | H10D 12/441 257/48 |
| 2020/0303524 A1 | 9/2020 | Matsudai et al. | |
| 2020/0303525 A1* | 9/2020 | Iwakaji | H10D 64/516 |
| 2020/0303526 A1* | 9/2020 | Iwakaji | H10D 62/142 |
| 2020/0357903 A1 | 11/2020 | Kubouchi | |
| 2020/0403089 A1* | 12/2020 | Ikura | H10D 64/513 |
| 2021/0091217 A1* | 3/2021 | Miyoshi | H10D 12/481 |
| 2021/0359677 A1* | 11/2021 | Miura | H02H 9/001 |
| 2022/0085190 A1* | 3/2022 | Matsudai | H10D 84/642 |
| 2022/0085193 A1* | 3/2022 | Matsudai | H10D 62/142 |
| 2022/0301982 A1* | 9/2022 | Itokazu | H01L 23/4824 |
| 2022/0302288 A1* | 9/2022 | Yasuhara | H10D 64/117 |

FOREIGN PATENT DOCUMENTS

| | | |
|---|---|---|
| JP | 2013-115223 A | 6/2013 |
| JP | 2016-092163 A | 5/2016 |
| JP | 6288678 B2 | 3/2018 |
| JP | 2020-155472 A | 9/2020 |
| JP | 2020-162022 A | 10/2020 |
| JP | 2021-077911 A | 5/2021 |
| WO | 2020/036015 A1 | 2/2020 |

OTHER PUBLICATIONS

"Notice of Reasons for Refusal" Office Action issued in JP 2021-182492; mailed by the Japanese Patent Office on Dec. 10, 2024.
Tatsunori Sakano et al., "Ultra-Low Switching Loss Triple-Gate controlled IGBT", May 30-Jun. 3, 2021. Nagoya Full Virtual Conference, Proc. Of The 33rd International Symposium on Power Semiconductor Devices and ICs (ISPSD), pp. 363-366.

* cited by examiner

F I G. 1
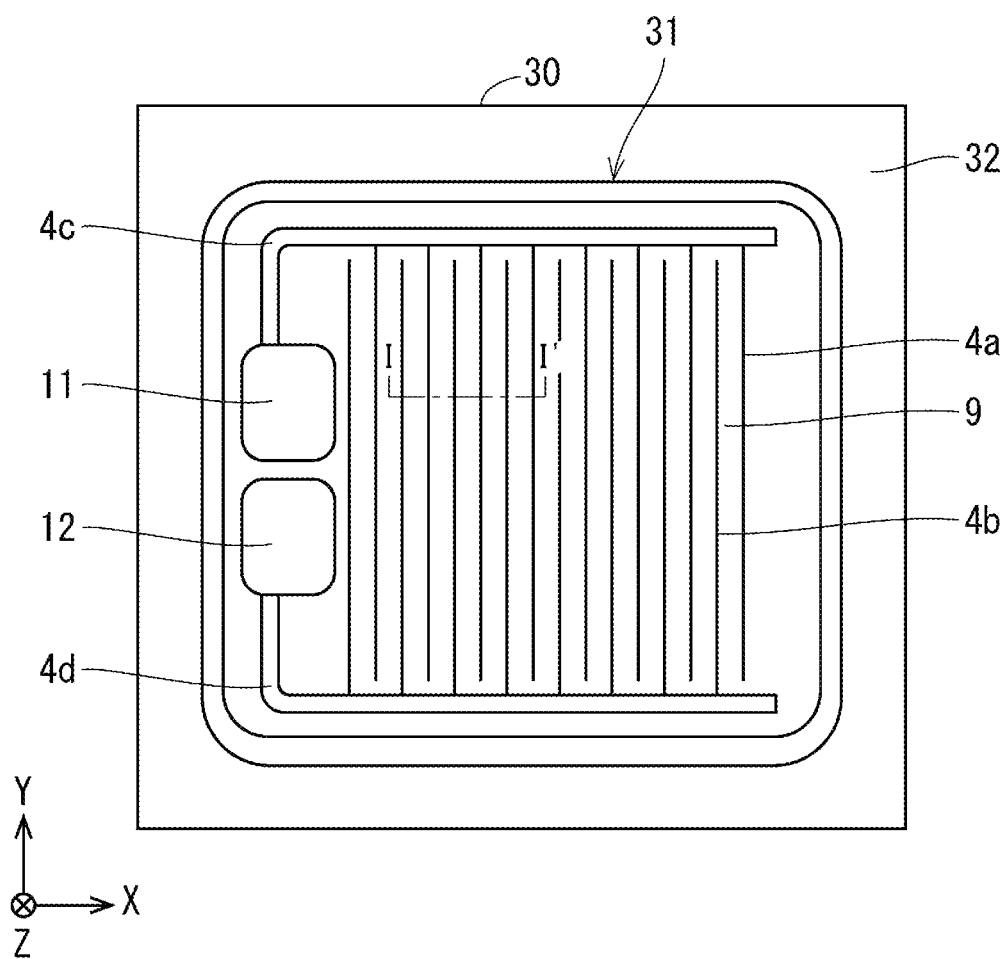

F I G. 3
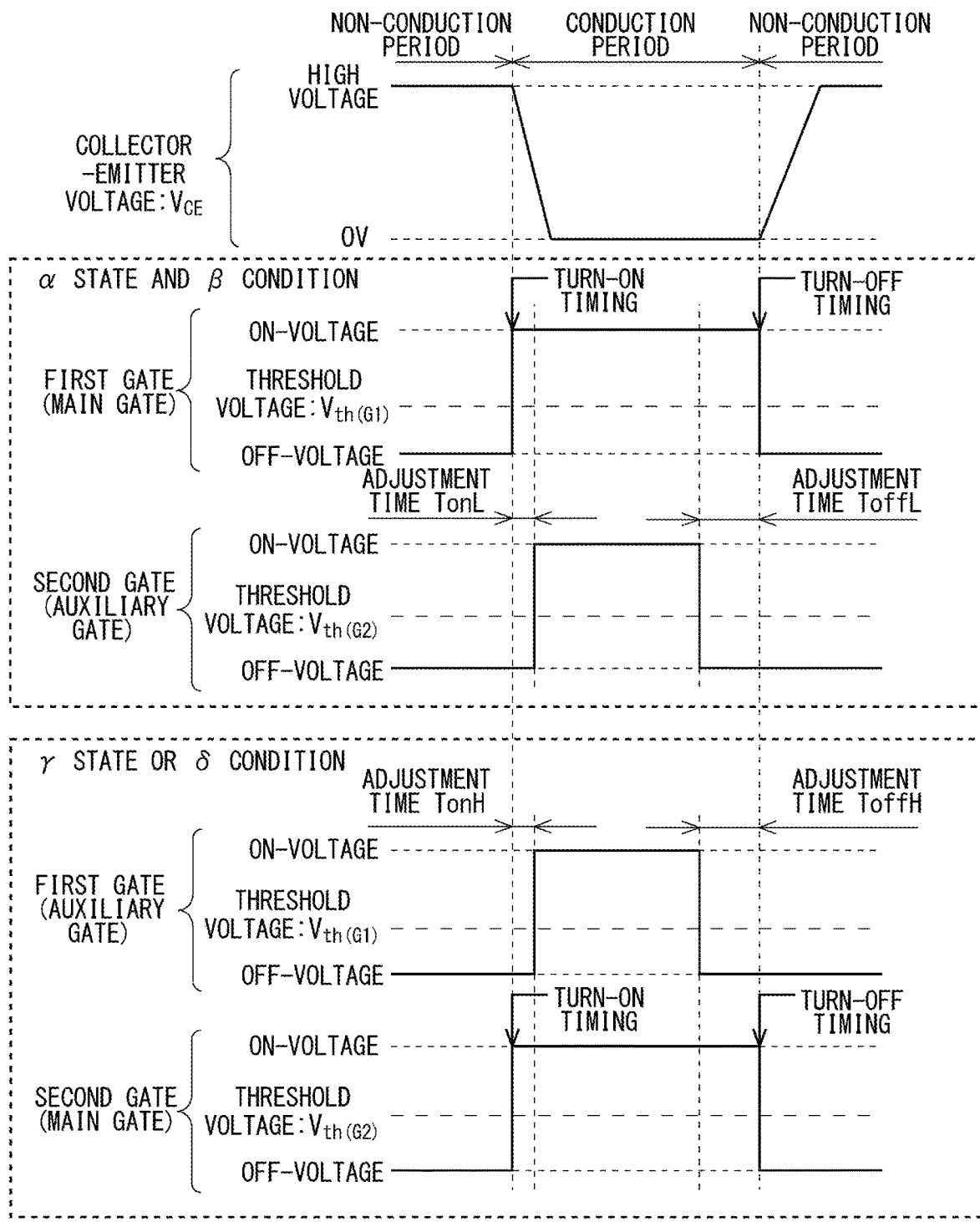

SEMICONDUCTOR DEVICE, POWER CONVERSION APPARATUS, AND METHOD FOR DRIVING SEMICONDUCTOR DEVICE

BACKGROUND OF THE INVENTION

Field of the Invention

The technique disclosed in the present specification relates to a semiconductor device including a plurality of gates.

Description of the Background Art

An insulated gate bipolar transistor (that is, IGBT) being a typical switching power device made of a silicon material is widely used as a key component of an energy saving apparatus, such as an inverter that performs variable speed control of a motor. An IGBT used in an inverter is required to reduce a loss, that is, to reduce an ON-voltage and a switching loss.

Since the height of the ON-voltage and the switching loss have a contradictory relationship, improvement in a trade-off relationship between the height of the ON-voltage and the switching loss is required to reduce the loss. However, more than 30 years have passed since the IGBT was introduced into the market, and it is said that the improvement in the loss thereof is approaching the limit, and great improvement is not expected.

For example, Japanese Patent No. 6288678 discloses a scaling design concept for improving a loss in a Si (silicon)-IGBT alone. Here, the scaling design concept is a method for reducing the ON-voltage or the loss of the gate drive circuit by scaling (that is, reducing) the mesa width, the trench depth, the gate insulating film, or the like after keeping the cell width constant.

By utilizing the scaling design concept described above, an improvement in loss (that is, loss reduction) can be achieved, and since the gate drive voltage is reduced in proportion to the scaling factor, the loss of the gate drive circuit is also reduced However, since there is not much room for improvement of the loss in the Si-IGBT alone, studies to improve the trade-off relationship between the height of the ON-voltage and the switching loss are also in progress by devising the drive control technology in addition to the scaling design concept described above.

A typical research thereof relates to a multi-gate IGBT disclosed in, for example, Japanese Patent Application Laid-Open No. 2020-162022 or Tatsunori Sakano, Kazuto Takao, "Ultra-Low Switching Loss Triple-Gate controlled IGBT", May 30-Jun. 3, 2021. Nagoya Full Virtual Conference, P363-366.

The multi-gate IGBT includes a main gate capable of controlling conduction and non-conduction timings and an auxiliary gate capable of controlling an internal carrier concentration of the multi-gate IGBT, and a loss can be reduced by combining these controls.

As an operation mode of the multi-gate IGBT including a plurality of gates that can be controlled independently of each other, application of a gate-emitter voltage (hereinafter, also referred to as "gate voltage") equal to or higher than a threshold voltage to at least one gate of the main gate and the auxiliary gate causes the multi-gate IGBT to enter a conductive state, and application of a gate voltage lower than the threshold voltage to all the gates causes the multi-gate IGBT to enter a non-conductive state. That is, the multi-gate IGBT is an IGBT capable of controlling conduction and non-conduction based on a gate voltage applied to a plurality of gates.

In the multi-gate IGBT, the main gate performs conduction and non-conduction timing control (that is, switching control). On the other hand, in order to control loss reduction at the time of switching between conduction and non-conduction or to control waveforms of a current and a voltage at the time of switching, the auxiliary gate adjusts an amount of accumulated carriers in the n-type base layer. Here, the control of the waveforms of the current and the voltage at the time of switching is to control di/dt or dv/dt at the time of switching, and prevents the switching operation from becoming an electro-magnetic interference source (noise) by the control (countermeasures against electromagnetic interference (that is, EMI)).

By combining the control by the main gate and the control by the auxiliary gate according to the purpose, it is possible to reduce the loss or reduce the generated noise.

A combination of a scaling design concept and a multi-gate IGBT is expected to contribute to a next generation Si-IGBT.

When a voltage is applied to the gate terminal of the semiconductor device, the voltage having a time width equal to or greater than a gate response time width necessary to form or extinguish the gate channel and being equal to or greater than a threshold voltage, a channel is generated (that is, in the ON state), and the semiconductor device transitions from the non-conduction state to the conduction state. On the other hand, when a voltage having a time width equal to or larger than the gate response time width and being less than the threshold voltage is applied to the gate terminal of the semiconductor device, the channel disappears (that is, in the OFF state), and the semiconductor device transitions from the conduction state to the non-conduction state. It should be noted that the threshold voltage is generally defined at room temperature (for example, 25° C.).

In a case where a voltage exceeding the threshold voltage is applied to the gate terminal, when the threshold voltage is low, a difference between the voltage applied to the gate terminal and the threshold voltage increases. Since the channel resistance being a component of the on-resistance is inversely proportional to the above difference, the ON-resistance can be reduced by lowering the threshold voltage, and thus the ON-voltage can be reduced.

In order to prevent malfunction even when an external noise voltage (externally-derived noise voltage) is applied to the gate terminal, it is necessary to prevent the external noise voltage from exceeding a difference between the drive voltage and the threshold voltage. Here, preventing malfunction even when an external noise voltage is applied to the gate terminal, that is, preventing reception of electromagnetic interference or enabling normal operation even when receiving electromagnetic interference is referred to as electromagnetic susceptibility (EMS) countermeasure.

Since the gate drive voltage is reduced in the scaling design concept, the difference between the drive voltage and the threshold voltage is reduced. Then, there is a problem that malfunction due to an external noise voltage is likely to occur.

Furthermore, in the semiconductor device, when self-heating occurs due to loss associated with the driving and the temperature rises, the threshold voltage decreases. For example, the threshold voltage at a temperature of 125° C. is about 15% lower than the threshold voltage at a temperature of 25° C. Therefore, even such a small external noise voltage as does not cause a malfunction (for example, turn-on operation) at a low temperature may cause a malfunction at a high temperature.

SUMMARY

The technique disclosed in the present specification is a technique for suppressing occurrence of malfunction even when a change in operating temperature is involved.

A semiconductor device according to a first aspect of the technique disclosed in the present specification includes a layer structure, and a first main electrode and a second main electrode configured to be electrically connected to each other through the layer structure. The layer structure includes a first semiconductor layer of a first conductivity type having a first surface and a second surface opposite the first surface, a first semiconductor region of a second conductivity type partially provided in a surface layer on the first surface, a second semiconductor region of a second conductivity type partially provided in a surface layer on the first surface, a second semiconductor layer of a first conductivity type partially provided in a surface layer in the first semiconductor region and a surface layer in the second semiconductor region, a first gate insulating film provided in contact with the first semiconductor region sandwiched between the first semiconductor layer and the second semiconductor layer, a second gate insulating film provided in contact with the second semiconductor region sandwiched between the first semiconductor layer and the second semiconductor layer, a first gate electrode being a gate electrode provided in contact with the first gate insulating film, and a second gate electrode being the gate electrode provided in contact with the second gate insulating film. Then, applying a voltage to the first gate electrode or the second gate electrode makes it possible to switch between an ON state in which the first main electrode and the second main electrode are conducting through the layer structure and an OFF state in which the first main electrode and the second main electrode are not conducting through the layer structure. A threshold voltage of the second gate electrode is higher than a threshold voltage of the first gate electrode. A state in which a temperature of the layer structure is lower than a threshold temperature is defined as an $\alpha$ state. A state in which a temperature of the layer structure is equal to or higher than the threshold temperature is defined as a $\gamma$ state. In the $\alpha$ state, a switching operation of switching to the ON state or the OFF state is performed using the first gate electrode. In the $\gamma$ state, the switching operation is performed using the second gate electrode.

Even when the threshold voltage of the gate electrode fluctuates with the change in the operating temperature, occurrence of malfunction of the semiconductor device can be effectively suppressed by selectively using a plurality of gate electrodes having different threshold voltages according to the operating temperature.

In addition, the objects, features, aspects, and advantages related to the technique disclosed in the specification of the present application will become further apparent from the detailed description and the accompanying drawings shown hereinafter.

BRIEF DESCRIPTION OF THE DRAWINGS

FIG. 1 is a plan view schematically showing an example of a configuration of an emitter electrode surface of a multi-gate IGBT being an example of a multi-gate semiconductor device including a plurality of gates;

FIG. 3 is a diagram for illustrating a method for driving the multi-gate semiconductor device according to the preferred embodiment;

DESCRIPTION OF THE PREFERRED EMBODIMENTS

Figure 2:
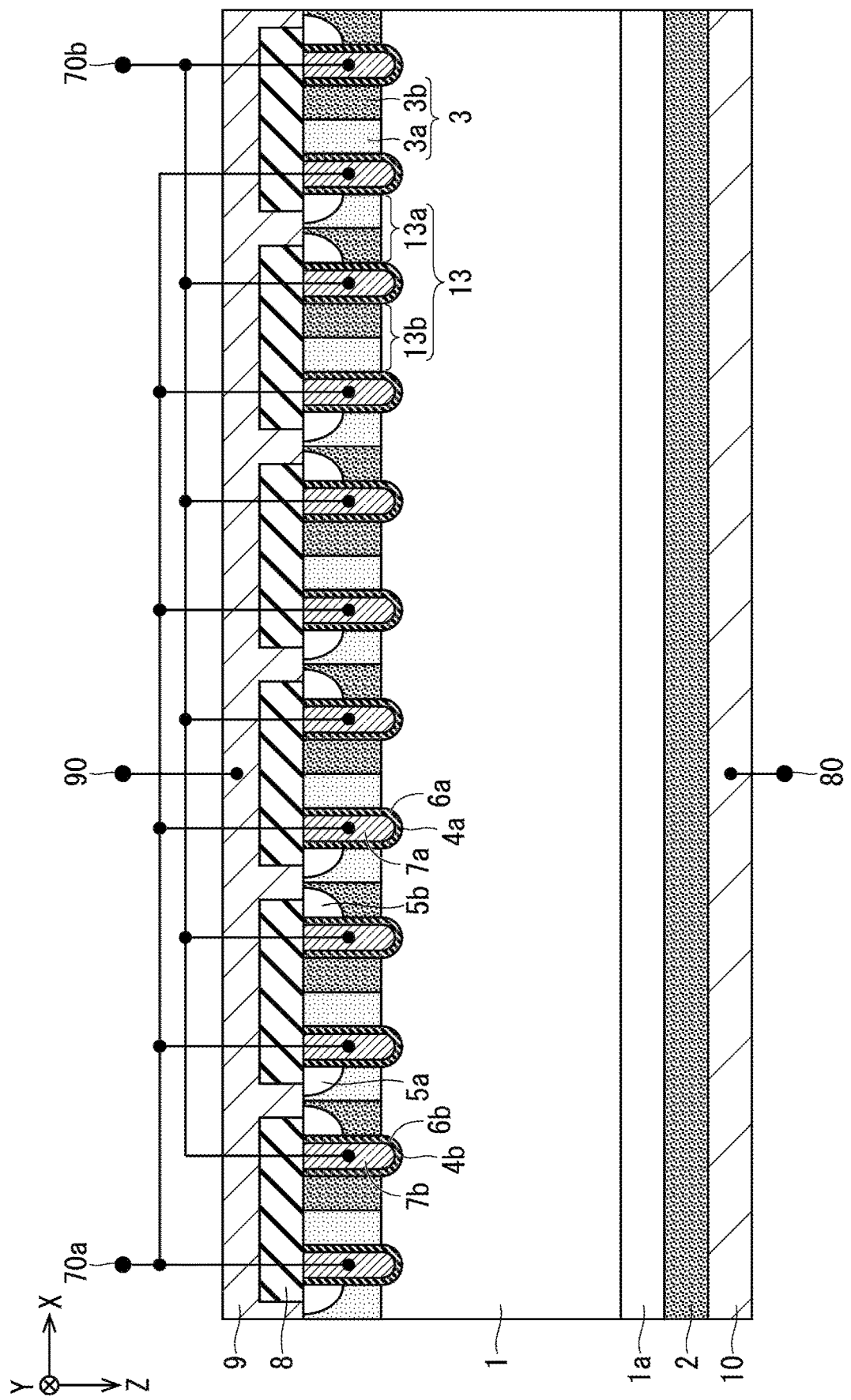
FIG. 2 is a cross-sectional view schematically showing an example of a configuration taken along line I-I' in FIG. 1.

Hereinafter, preferred embodiments will be described with reference to the accompanying drawings. In the following preferred embodiments, detailed features and the like are also shown for the description of the technique, but they are merely examples, and not all of them are necessarily essential features for enabling the preferred embodiments to be carried out.

It should be noted that the drawings are schematically shown, and for convenience of description, omission of the configuration, simplification of the configuration, or the like may be made in the drawings as appropriate. In addition, the mutual relationship between the sizes and positions of the respective configurations shown in the different drawings is not necessarily described accurately and can be appropriately changed. In addition, in drawings such as plan views other than cross-sectional views, hatching may be added in order to facilitate understanding of the contents of the preferred embodiments.

In addition, in the following description, the same components are denoted by the same reference numerals to be illustrated, and their names and functions are also the same. Therefore, detailed descriptions thereof may be omitted to avoid redundancy.

In addition, in the description given in the present specification, when description such as "comprising", "including", or "having" a certain component is made, it is not an exclusive expression excluding the presence of other components unless otherwise noted.

In addition, in the description given in the present specification, ordinal numbers such as "first" or "second" may be used, but these terms are used to facilitate understanding of the contents of the preferred embodiments for convenience, and the contents of the preferred embodiments are not limited to the order or the like that can be generated by these ordinal numbers.

In addition, in the description given in the present specification, in the expression such as " . . . axis positive direction" or " . . . axis negative direction", a direction along the arrow of the . . . axis shown is a positive direction, and a direction opposite to the arrow of the . . . axis shown is a negative direction.

In addition, in the description given in the present specification, terms that mean a specific position or direction such as "upper", "lower", "left", "right", "side", "bottom", "front", or "back" may be used, but these terms are used to facilitate understanding of the contents of the preferred embodiments for convenience and the preferred embodiments are not related to the position or direction at the time of actual implementation.

In addition, in the description given in the present specification, when it is described as "the upper surface of . . . ", "the lower surface of . . . ", or the like, it is assumed to include α state in which another component is formed on the upper surface or the lower surface of the target component in addition to the upper surface itself or the lower surface itself of the target component. That is, for example, the description "B provided on the upper surface of A" does not preclude the interposition of another component "C" between A and B.

First Preferred Embodiment

Hereinafter, a semiconductor device and a method for driving the semiconductor device according to the present preferred embodiment will be described.

It should be noted that in the description hereinafter, regarding a conductivity type of an impurity, it is assumed that a first conductivity type is n-type and a second conductivity type is p-type.

In addition, in the following description, the expression "A and B are electrically connected" means that a current can flow bidirectionally between the configuration A and the configuration B.

<Configuration of Semiconductor Device>

In the following preferred embodiments, an insulated gate (gate control) semiconductor device will be described.

FIG. 1 is a plan view schematically showing an example of a configuration of an emitter electrode surface of a multi-gate (that is, MG)-IGBT being an example of a multi-gate semiconductor device including a plurality of gates. In addition, FIG. 2 is a cross-sectional view schematically showing an example of a configuration taken along line I-I' in FIG. 1.

In the present preferred embodiment, two gates are provided on a first main surface (emitter surface) of an n-type semiconductor substrate 30 having two main surfaces, and the two gates have an enhancement n-channel metal-oxide-semiconductor field-effect transistor (that is, MOSFET) structure.

An MG-IGBT element 31 is provided on the n-type semiconductor substrate 30, and a termination structure 32 for suppressing electric field concentration is provided around the MG-IGBT element 31.

In the present preferred embodiment, as the semiconductor substrate 30, for example, an n-type (n⁻) single crystal bulk silicon substrate (FZ wafer) having an impurity concentration of about $1\times10^{14}$ cm$^{-3}$ is adopted. The semiconductor substrate 30 functions as an n-type base layer 1 of the MG-IGBT element 31.

The surface layer on the first main surface (emitter surface) of the semiconductor substrate 30 of the MG-IGBT element 31 is formed with a p-type base region 3. The p-type base region 3 includes a p-type base region 3a and a p-type base region 3b having an impurity concentration higher than the impurity concentration of the p-type base region 3a. The p-type base region 3a and the p-type base region 3b, provided on the emitter surface and formed in the surface layer of the n-type base layer 1, are arranged alternately with each other as shown with an example in FIG. 2.

The p-type base region 3a is formed with a trench 4a that penetrates the p-type base region 3a and further reaches the inside of the n-type base layer 1. Similarly, the p-type base region 3b is formed with a trench 4b that penetrates the p-type base region 3b and further reaches the inside of the n-type base layer 1.

The bottom surface and the side surface in the trench 4a are formed with a gate insulating film 6a. In addition, an inner region surrounded by the gate insulating film 6a in the trench 4a is filled with, for example, polysilicon having an impurity concentration of about $1\times10^{20}$ cm$^{-3}$, and a gate electrode 7a is formed.

Similarly, the bottom surface and the side surface in the trench 4b are formed with a gate insulating film 6b. In addition, an inner region surrounded by the gate insulating film 6b in the trench 4b is filled with, for example, polysilicon having an impurity concentration of about $1\times10^{20}$ cm$^{-3}$, and a gate electrode 7b is formed.

In addition, the mesa shape 13 (that is, the p-type base region sandwiched between the adjacent trenches) partitioned by the trench 4a and the trench 4b is arranged with a p-type base region 3a and a p-type base region 3b. These structures are repeatedly arranged with the p-type base region 3a, the trench 4a, the p-type base region 3a, the p-type base region 3b, the trench 4b, and the p-type base region 3b in this order along the X-axis positive direction in FIG. 2.

In addition, the surface layer in the p-type base region 3a is selectively formed with an n-type (n⁺) emitter layer 5a adjacent to a part of the side surface portion of the gate electrode 7a. In addition, the surface layer in the p-type base region 3b is selectively formed with an n-type (n⁺) emitter layer 5b adjacent to a part of the side surface portion of the gate electrode 7b.

Here, the mesa shape 13 in which the n⁺-type emitter layer 5a and the n⁺-type emitter layer 5b are formed is also referred to as a mesa 13a. In addition, the mesa shape 13 in which the n⁺-type emitter layer 5a and the n⁺-type emitter layer 5b are not formed is also referred to as a mesa 13h. The mesa 13a and the mesa 13b are alternately arranged in the X-axis positive direction in FIG. 2.

In the present preferred embodiment, the n⁺-type emitter layer 5a and the n⁺-type emitter layer 5b have a thickness of about 0.5 μm and an impurity concentration of about $3\times10^{19}$ cm$^{-3}$.

The p-type base region 3a facing the gate electrode 7a in the mesa 13a functions as a first channel formation region. In addition, the p-type base region 3b facing the gate electrode 7b in the mesa 13a functions as a second channel formation region.

The upper surface of the n-type base layer 1 is partially formed with an insulating film 8. In addition, an emitter electrode 9 is formed to cover the insulating film 8 and the upper surface (that is, a part of the upper surface of the mesa 13a) of the n-type base layer 1 exposed without being covered with the insulating film 8. The emitter electrode 9 is further connected to the emitter terminal 90.

On the upper surface of the mesa 13a, the p-type base region 3a, the p-type base region 3b, the n⁺-type emitter layer 5a, and the n⁺-type emitter layer 5b are electrically connected to the emitter electrode 9.

On the other hand, since covered with the insulating film 8, the upper surfaces of the trench 4a, the trench 4b, and the mesa 13b are insulated and separated from the emitter electrode 9. However, a small area of the upper surface of the mesa 13b is connected to the emitter electrode 9 and has contact resistance (not shown here).

As shown with an example in FIG. 1, a gate pad 11 and a gate pad 12 insulated and separated from the emitter electrode 9 are disposed on a first main surface (emitter surface) of the n-type semiconductor substrate 30.

The gate pad 11 is made of an aluminum-based material. The gate pad 11 is electrically connected to the gate electrode 7a through the trench routing wiring line 4c.

The gate pad 12 is made of an aluminum-based material. The gate pad 12 is electrically connected to the gate electrode 7b through the trench routing wiring line 4d.

The trench routing wiring line 4c has a trench structure similar to that of the trench 4a, and a gate insulating film is formed on a bottom surface and a side surface in the trench. In addition, an inner region surrounded by the gate insulating film in the trench is filled with polysilicon having an impurity concentration of about $1\times10^{20}$ cm$^{-3}$, for example, to form a wiring path. Since having the upper surface covered with the insulating film 8, the wiring path is insulated and separated from the emitter electrode 9.

The trench routing wiring line 4d has a trench structure similar to that of the trench 4b, and a gate insulating film is formed on a bottom surface and a side surface in the trench. In addition, an inner region surrounded by the gate insulating film in the trench is filled with polysilicon having an impurity concentration of about $1\times10^{20}$ cm$^{-3}$, for example, to form a wiring path. Since having the upper surface covered with the insulating film 8, the wiring path is insulated and separated from the emitter electrode 9.

The surface layer on the second main surface (collector surface) of the n-type semiconductor substrate 30 is formed with a p-type (p$^+$) collector region 2. In the present preferred embodiment, the p$^+$-type collector region 2 has, for example, a thickness of about 0.5 μm and an impurity concentration of about $1\times10^{18}$ cm$^{-3}$.

In addition, in the present preferred embodiment, as shown with an example in FIG. 2, an n$^+$-type buffer layer 1a for stopping a depletion layer is formed between the semiconductor substrate 30 and the p$^+$-type collector region 2.

In the configuration shown in FIG. 2, the thickness from the upper surface (that is, the upper surface of the semiconductor substrate 30) in the p-type base region 3 to the lower surface (that is, the second main surface of the semiconductor substrate 30) in the p$^+$-type collector region 2 is, for example, about 120 μm.

In addition, on the lower surface in the p$^+$-type collector region 2, for example, a collector electrode 10 made of an aluminum-based material is provided. The p$^+$-type collector region 2 and the collector electrode 10 are electrically connected. The collector electrode 10 is further connected to the collector terminal 80.

Incidentally, the operating temperature of the MG-IGBT and the threshold voltage have an inversely proportional relationship, and the threshold voltage at room temperature decreases by about 15% at a temperature of 125° C.

Since the threshold voltage varies in inverse proportion to the temperature, the threshold voltage of the main gate becomes lower during high-temperature operation than during room-temperature operation, which causes malfunction due to external noise voltage.

Thus, in the MG-IGBT according to the present preferred embodiment, gates having different threshold voltages are used as the main gate depending on the operating temperature of the MG-IGBT element 31. It should be noted that the operating temperature of the semiconductor device corresponds to the temperature of the loss occurrence starting point of the semiconductor device. The loss occurrence starting point of the semiconductor device refers to a temperature near the pn boundary, corresponds to the junction temperature (Tj) in the bipolar transistor because the pn junction maintaining the withstand voltage characteristic is the loss occurrence starting point, and corresponds to the channel temperature (Tc) in the MOSFET because the region maintaining the withstand voltage characteristic and having a channel formed by the gate signal is the loss occurrence starting point.

In the present preferred embodiment, since the impurity concentration of the p-type base region 3b corresponding to the second channel formation region is higher than the impurity concentration of the p-type base region 3a corresponding to the first channel formation region, the threshold voltage (gate voltage) for forming a channel in the second channel formation region is higher than the threshold voltage (gate voltage) for forming a channel in the first channel formation region.

As a specific operation, when the operating temperature of the MG-IGBT element 31 is lower than 75° C., switching control is performed with the gate electrode 7a being a low threshold voltage as a main gate, and the gate electrode 7b is used as an auxiliary gate. Here, the auxiliary gate controls the internal carrier concentration of the MG-IGBT element 31. It should be noted that the gate electrode 7a is further connected to the gate terminal 70a. In addition, the gate electrode 7b is further connected to the gate terminal 70b.

When the gate electrode 7a is continuously switching-controlled as the main gate even when the operating temperature of the MG-IGBT element 31 is 75° C. or higher, it may cause a malfunction due to an external noise voltage.

Thus, when the operating temperature of the MG-IGBT element 31 is 75° C. or higher, the gate electrode 7b having a higher threshold voltage than the gate electrode 7a is switching-controlled as the main gate instead of the gate electrode 7a. Then, the gate electrode 7a is used as an auxiliary gate.

The reason why the main gate is selectively used as described above when the operating temperature of the MG-IGBT element 31 is 75° C. is that the multi-gate semiconductor device is generally used in a temperature range from room temperature (25° C.) to 125° C., and the operating temperature is divided at the intermediate temperature (75° C.) in the range.

The threshold voltage of the gate electrode 7b used as the main gate when the operating temperature of the MG-IGBT is 75° C. or higher is set to have a voltage difference of about 15% (that is, the threshold voltage of the gate electrode 7b is higher, by 10% or more, than the threshold voltage of the gate electrode 7a) as compared with the threshold voltage of the gate electrode 7a used as the main gate when the operating temperature of the MG-IGBT is lower than 75° C.

Since the threshold voltage at the temperature of 125° C. is about 15% lower than the threshold voltage at the room temperature of 25° C., the threshold voltage at the intermediate temperature (75° C.) is about several % lower than the threshold voltage at the room temperature (25° C.). Therefore, in consideration of a manufacturing error at the time of device manufacturing, by setting the threshold voltage of the gate electrode 7a and the threshold voltage of the gate electrode 7b to have a voltage difference of about 15%, the threshold voltage (that is, the threshold voltage decreased by about 5%) of the gate electrode 7b at the intermediate temperature (75° C.) is prevented from being equal to or less than the threshold voltage of the gate electrode 7a at room temperature (25° C.).

The main gate is selectively used depending on not only the above temperature condition but also the current value. When a rated current is flowed as a direct current at room temperature (25° C.), the temperature of the multi-gate semiconductor device reaches about 125° C. due to conduction loss, so that 125° C. can be set as the upper limit of the operating temperature. In actual application, a current is not flowed as a direct current, but a rated current is flowed with a pulse wave, and a temperature of the multi-gate semiconductor device reaches about 125° C. by heat generated from a sum of a conduction loss and a switching loss due to the pulse current. When a current of ½ of the rated current is flowed, the temperature of the multi-gate semiconductor device is about 75° C., so that the gate electrode 7a and the gate electrode 7b can be selectively used in consideration of the influence of the current.

FIG. 3 is a diagram for illustrating a method for driving the multi-gate semiconductor device according to the present preferred embodiment. In FIG. 3, together with a voltage $V_{CE}$ applied between the collector terminal 80 and the emitter terminal 90, a conduction period and a non-conduction period between the collector terminal 80 and the emitter terminal 90 (that is, a layer structure sandwiched between the collector terminal 80 and the emitter terminal 90) are shown.

A state at a low temperature (that is, the temperature of the multi-gate semiconductor device is lower than 75° C.) is defined as an α state. In addition, the condition that the turn-on switching current (current flowing when the multi-gate semiconductor device comes into the ON state being the conductive state) or the turn-off switching current (current flowing when the multi-gate semiconductor device comes into the OFF state being the non-conductive state) is less than ½ of the rated current A is defined as the β condition.

In this case, in the α state and the β condition, the gate electrode (first gate) having a lower threshold voltage is set as the main gate, and the gate electrode (second gate) having a higher threshold voltage is set as the auxiliary gate. Then, at the time of turn-on switching, the turn-on control signal is input from the auxiliary gate later by the "adjustment time TonL" than the time of turn-on switching (that is, temporally later), and at the time of turn-off switching, the turn-off control signal is input from the auxiliary gate earlier by the "adjustment time ToffL" than the time of turn-off switching (that is, temporally later). It should be noted that even when the β condition is not satisfied (that is, when only the α state is satisfied), a gate electrode (first gate) having a lower threshold voltage is set as the main gate, a gate electrode (second gate) having a higher threshold voltage is set as the auxiliary gate, a turn-on control signal can be input from the auxiliary gate later by the "adjustment time TonL" than the time of turn-on switching at the time of turn-on switching, and a turn-off control signal can be input from the auxiliary gate earlier by the "adjustment time ToffL" than the time of turn-off switching at the time of turn-off switching.

In order to reduce the loss at the time of the turn-on switching, it is desirable to simultaneously input the turn-on control signals of the main gate and the auxiliary gate without shifting the input timings. However, in this case, the surge current at the time of turn-on switching increases, and $dI_{on}/dt$ at the time of turn-on switching increases, which adversely affects EMI. Therefore, it is desirable to provide an appropriate "adjustment time TonL" in order to reduce $dI_{on}/dt$.

In order to reduce the loss at the time of the turn-off switching, it is desirable to greatly shift the input timings of the turn-off control signals of the main gate and the auxiliary gate. However, in this case, the surge voltage at the time of the turn-off switching increases, and $dV_{off}/dt$ at the time of the turn-off switching increases, which adversely affects EMI. Therefore, in order to reduce $dV_{off}/dt$, it is desirable to provide an appropriate "adjustment time ToffL" that is not too large.

On the other hand, when a gate electrode having a low threshold voltage at a high temperature is used as the main gate, malfunction is likely to occur when the threshold voltage decreases due to the influence of temperature, Thus, at the time of high temperature, the second gate having a threshold voltage equal to or higher than the threshold voltage of the first gate at the time of low temperature even at the time of high temperature is set as the main gate, and instead, the first gate that has been set as the main gate at the time of low temperature is switched to the auxiliary gate.

A state at a high temperature (that is, the temperature of the multi-gate semiconductor device is equal to or higher than 75° C.) is defined as the γ state. In addition, the condition that the turn-on switching current (current flowing when the multi-gate semiconductor device comes into the ON state) or the turn-off switching current (current flowing when the multi-gate semiconductor device comes into the OFF state) is equal to or larger than ½ of the rated current A is defined as the β condition.

In this case, in the γ state or the β condition, the gate electrode (first gate) having a lower threshold voltage is set as the auxiliary gate, and the gate electrode (second gate) having a higher threshold voltage is set as the main gate. Then, at the time of turn-on switching, the turn-on control signal is input from the auxiliary gate earlier by the "adjustment time TonH" than the time of turn-on switching (that is, temporally earlier), and at the time of turn-off switching, the turn-off control signal is input from the auxiliary gate later by the "adjustment time ToffH" than the time of turn-off switching (that is, temporally later).

The "adjustment time TonH" or the "adjustment time ToffH" needs to be appropriately selected in consideration of $dI_{on}/dt$ or $dV_{off}/dt$ so as not to adversely affect EMI.

Incidentally, in order to make the threshold voltage of the gate electrode 7b (second gate) higher than the threshold voltage of the gate electrode 7a (first gate), there is a method of making the impurity concentration of the p-type base region 3b higher than the impurity concentration of the p-type base region 3a, making the thickness of the gate insulating film 6b larger than the thickness of the gate insulating film 6a, making the dielectric constant of the gate insulating film 6b lower than the dielectric constant of the gate insulating film 6a, making the gate length of the gate electrode 7b (distance of the p-type base region 3b from the $n^4$-type emitter layer 5b to the n-type base layer 1) larger than the gate length of the gate electrode 7a (distance of the p-type base region 3a from the $n^+$-type emitter layer 5a to the n-type base layer 1), or the like.

In the MG-IGBT element 31 according to the present preferred embodiment, the threshold voltage of the gate electrode 7b (second gate) is made higher than the threshold voltage of the gate electrode 7a (first gate) by making the impurity concentration in the p-type base region 3b higher than the impurity concentration in the p-type base region 3a, but the threshold voltage of the gate electrode 7b (second gate) may be made higher than the threshold voltage of the gate electrode 7a (first gate) using (or combining) at least one of the methods listed above.

Figure 4:
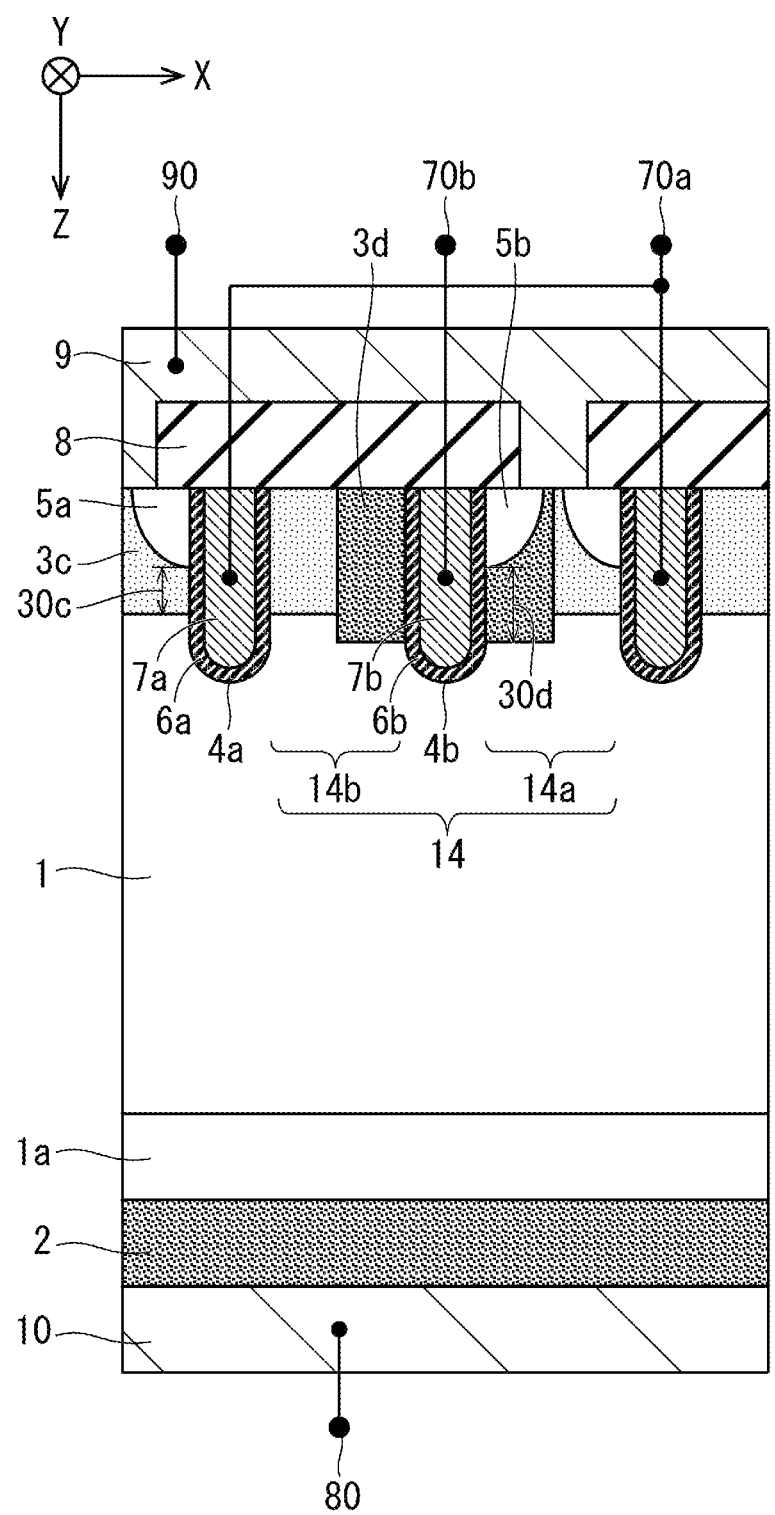
FIG. 4 is a cross-sectional view schematically showing another configuration example of the multi-gate semiconductor device according to the preferred embodiment.

FIG. 4 is a cross-sectional view schematically showing another configuration example of the multi-gate semiconductor device according to the present preferred embodiment. In FIG. 4, the gate length of the gate electrode 7b is larger than the gate length of the gate electrode 7a.

As shown with an example in FIG. 4, the surface layer of the n-type base layer 1 is formed with a p-type base region 3c and a p-type base region 3d having an impurity concentration higher than the impurity concentration in the p-type base region 3c. The p-type base region 3c and the p-type base region 3d are arranged alternately with each other as shown with an example in FIG. 4.

The p-type base region 3c is formed with a trench 4a that penetrates the p-type base region 3c and further reaches the inside of the n-type base layer 1. Similarly, the p-type base region 3d is formed with a trench 4b that penetrates the p-type base region 3d and further reaches the inside of the n-type base layer 1.

The bottom surface and the side surface in the trench 4a are formed with a gate insulating film 6a. In addition, an inner region surrounded by the gate insulating film 6a in the trench 4a is filled with, for example, polysilicon having an impurity concentration of about $1 \times 10^{20}$ cm$^{-3}$, and a gate electrode 7a is formed.

Similarly, the bottom surface and the side surface in the trench 4b are formed with a gate insulating film 6b. In addition, an inner region surrounded by the gate insulating film 6b in the trench 4b is filled with, for example, polysilicon having an impurity concentration of about $1 \times 10^{20}$ cm$^{-3}$, and a gate electrode 7b is formed.

In addition, the mesa shape 14 (that is, the p-type base region sandwiched between the adjacent trenches) partitioned by the trench 4a and the trench 4b is arranged with a p-type base region 3c and a p-type base region 3d. These structures are repeatedly arranged with the p-type base region 3c, the trench 4a, the p-type base region 3c, the p-type base region 3d, the trench 4b, and the p-type base region 3d in this order along the X-axis positive direction in FIG. 4.

In addition, the surface layer in the p-type base region 3c is selectively formed with an n-type (n$^+$) emitter layer 5a adjacent to a part of the side surface portion of the gate electrode 7a. In addition, the surface layer in the p-type base region 3d is selectively formed with an n-type (n$^+$) emitter layer 5b adjacent to a part of the side surface portion of the gate electrode 7b.

Here, the mesa shape 14 in which the n$^+$-type emitter layer 5a and the n$^+$-type emitter layer 5b are formed is also referred to as a mesa 14a. In addition, the mesa shape 14 in which the n$^+$-type emitter layer 5a and the n$^+$-type emitter layer 5b are not formed is also referred to as a mesa 14b. The mesa 14a and the mesa 14b are alternately arranged in the X-axis positive direction in FIG. 4.

In FIG. 4, the gate length of the gate electrode 7b (that is, the distance 30d of the p-type base region 3d from the lower surface of the n$^+$-type emitter layer 5b to the n-type base layer 1) is larger than the gate length of the gate electrode 7a (that is, the distance 30c of the p-type base region 3c from the lower surface of the n$^+$-type emitter layer 5a to the n-type base layer 1).

The structure illustrated in FIG. 4 can also produce effects similar to those of the structures illustrated in FIGS. 1 to 3.

According to the multi-gate semiconductor device according to the present preferred embodiment, the resistance to the external noise voltage can be increased and the malfunction can be suppressed by switching and using the gate electrodes having different threshold voltages as the main gate according to the operating condition. In addition, the loss can be suppressed by minimizing the sacrifice of the ON-voltage.

Second Preferred Embodiment

A semiconductor device and a method for driving the semiconductor device according to the present preferred embodiment will be described. It should be noted that in the following description, the same components as those described in the preferred embodiment described above are denoted by the same reference numerals and illustrated, and the detailed description thereof will be appropriately omitted.

<Configuration of Semiconductor Device>

In the present preferred embodiment, an MG-IGBT having three or more gates will be described as an example of a multi-gate semiconductor device having three or more gates.

Figure 5:
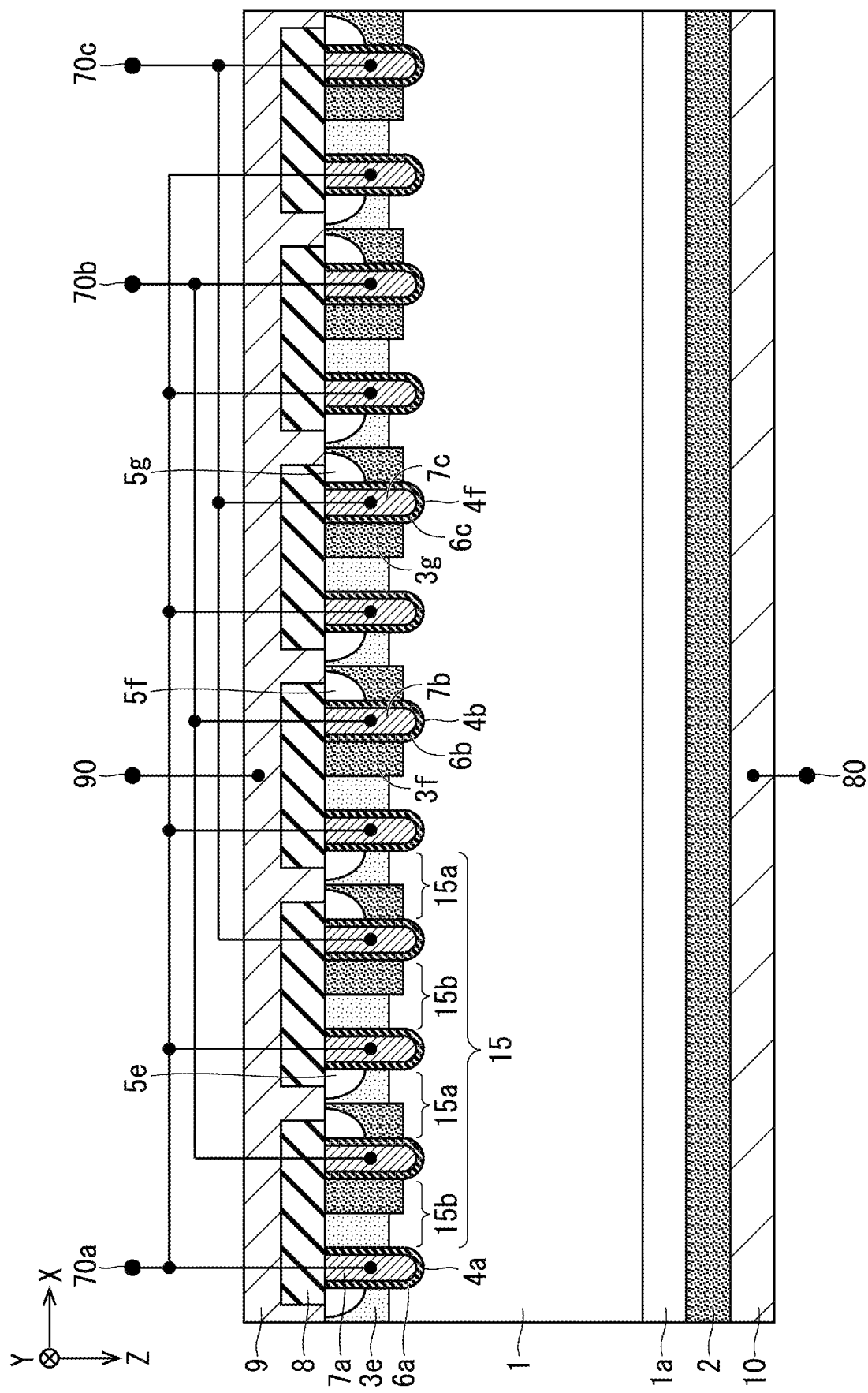
FIG. 5 is a cross-sectional view schematically showing a configuration example of the multi-gate semiconductor device according to the preferred embodiment.

FIG. 5 is a cross-sectional view schematically showing a configuration example of the multi-gate semiconductor device according to the present preferred embodiment. In the example shown in FIG. 5, the multi-gate semiconductor device includes three gates.

As shown with an example in FIG. 5, the surface layer on the first main surface in the n-type base layer 1 is formed with a p-type base region 3e, a p-type base region 3f having an impurity concentration higher than the impurity concentration in the p-type base region 3e, and a p-type base region 3g having an impurity concentration equal to or higher than the impurity concentration in the p-type base region 3e and equal to or lower than the impurity concentration in the p-type base region 3f.

The p-type base region 3e is formed with a trench 4a that penetrates the p-type base region 3e and further reaches the inside of the n-type base layer 1. Similarly, the p-type base region 3f is formed with a trench 4b that penetrates the p-type base region 3f and further reaches the inside of the n-type base layer 1. Similarly, the p-type base region 3g is formed with a trench 4f that penetrates the p-type base region 3g and further reaches the inside of the n-type base layer 1.

The bottom surface and the side surface in the trench 4a are formed with a gate insulating film 6a. In addition, an inner region surrounded by the gate insulating film 6a in the trench 4a is filled with, for example, polysilicon having an impurity concentration of about $1 \times 10^{20}$ cm$^{-3}$, and a gate electrode 7a is formed. The gate electrode 7a is further connected to the gate terminal 70a.

Similarly, the bottom surface and the side surface in the trench 4b are formed with a gate insulating film 6b. In addition, an inner region surrounded by the gate insulating film 6b in the trench 4b is filled with, for example, polysilicon having an impurity concentration of about $1 \times 10^{20}$ cm$^{-3}$, and a gate electrode 7b is formed. The gate electrode 7b is further connected to the gate terminal 70b.

Similarly, the bottom surface and the side surface in the trench 4f are formed with a gate insulating film 6c. In addition, an inner region surrounded by the gate insulating film 6c in the trench 4f is filled with, for example, polysilicon having an impurity concentration of about $1 \times 10^{20}$ cm$^3$, and a gate electrode 7c is formed. The gate electrode 7c is further connected to the gate terminal 70c.

In addition, the mesa shape 15 (that is, the p-type base region sandwiched between the adjacent trenches) partitioned by the trench 4a, the trench 4b, and the trench 4f is arranged with a p-type base region 3e, a p-type base region 3fe, and a p-type base region 3g. These structures are repeatedly arranged with the p-type base region 3e, the trench 4a, the p-type base region 3e, the p-type base region 3f, the trench 4b, the p-type base region 3f, the p-type base region 3e, the trench 4a, the p-type base region 3e, the p-type base region 3g, the trench 4f, and the p-type base region 3g in this order along the X-axis positive direction in FIG. 5.

In addition, the surface layer in the p-type base region 3e is selectively formed with an n-type (n⁺) emitter layer 5e adjacent to a part of the side surface portion of the gate electrode 7a. In addition, the surface layer in the p-type base region 3f is selectively formed with an n-type (n⁺) emitter layer 5f adjacent to a part of the side surface portion of the gate electrode 7b. In addition, the surface layer in the p-type base region 3g is selectively formed with an n-type (n⁺) emitter layer 5g adjacent to a part of the side surface portion of the gate electrode 7c.

Here, the mesa shape 15 in which the n⁺-type emitter layer 5e and the n⁺-type emitter layer 5f or the n⁺-type emitter layer 5e and the n⁺-type emitter layer 5g are formed is also referred to as a mesa 15a. In addition, the mesa shape 15 in which none of the n⁺-type emitter layer 5e and the n⁺-type emitter layer 5f or the n⁺-type emitter layer 5e and the n⁺-type emitter layer 5g is formed is also referred to as a mesa 15b. The mesa 15a and the mesa 15b are alternately arranged in the X-axis positive direction in FIG. 5.

The p-type base region 3e facing the gate electrode 7a in the mesa 15a functions as a first channel formation region. In addition, the p-type base region 3f facing the gate electrode 7b in the mesa 15a functions as a second channel formation region. In addition, the p-type base region 3g facing the gate electrode 7c in the mesa 15a functions as a third channel formation region.

The upper surface of the n-type base layer 1 is partially formed with an insulating film 8. In addition, an emitter electrode 9 is formed to cover the insulating film 8 and the upper surface (that is, a part of the upper surface of the mesa 15a) of the n-type base layer 1 exposed without being covered with the insulating film 8. The emitter electrode 9 is further connected to the emitter terminal 90.

On the upper surface of the mesa 15a, the p-type base region 3e, the p-type base region 3f, the p-type base region 3g, the n⁺-type emitter layer 5e, the n⁺-type emitter layer 5f, and the n⁺-type emitter layer 5g are electrically connected to the emitter electrode 9.

On the other hand, since covered with the insulating film 8, the upper surfaces of the trench 4a, the trench 4b, and the mesa 15b are insulated and separated from the emitter electrode 9. However, a small area of the upper surface of the mesa 15b is connected to the emitter electrode 9 and has contact resistance (not shown here).

Similarly to the case illustrated in FIG. 1, on the upper surface of the n-type base layer 1, a plurality of respective gate pads insulated and separated from the emitter electrode 9 are disposed to be connected to the corresponding gate terminal 70a, gate terminal 70b, and gate terminal 70c.

Each of the gate pads is made of an aluminum-based material. Then, each gate pad is electrically connected to the corresponding gate electrode through the trench routing wiring line.

Each trench routing wiring line has a trench structure similar to the trench 4a, the trench 4b, or the trench 4f, and the bottom surface and the side surface in the trench are formed with a gate insulating film. In addition, an inner region surrounded by the gate insulating film in the trench is filled with polysilicon having an impurity concentration of about $1 \times 10^{20}$ cm⁻³, for example, to form a wiring path. Since having the upper surface covered with the insulating film 8, the wiring path is insulated and separated from the emitter electrode 9.

In the MG-IGBT according to the present preferred embodiment, the impurity concentration of the p-type base region 3f is higher than the impurity concentration of the p-type base region 3e. The impurity concentration of the p-type base region 3g is equal to or higher than the impurity concentration of the p-type base region 3e and equal to or lower than the impurity concentration of the p-type base region 3f.

Therefore, regarding the threshold voltage magnitude, the threshold voltage of the gate electrode 7a≤the threshold voltage of the gate electrode 7c≤the threshold voltage of the gate electrode 7b.

Therefore, when the turn-on control signals (voltages) having the same magnitude are input, the channel is formed in the order of the p-type base region 3e facing the gate electrode 7a (first gate), the p-type base region 3g facing the gate electrode 7c (third gate d the p-type base region 3f facing the gate electrode 7b (second gate). In addition, when the turn-off control signal (voltage) having the same magnitude is input, the channel disappears in the order of the p-type base region 3f facing the gate electrode 7b, the p-type base region 3g facing the gate electrode 7c, and the p-type base region 3e facing the gate electrode 7a.

When the third gate is controlled according to the purpose, control of the switching waveform more precise than a case of control with only two gates of the first gate and the second gate (specifically, precise control of $dI_{on}/dt$ or $dV_{off}/dt$) is made possible, and it is possible to secure the likelihood of waveform adjustment. Thus, the third gate is used as an auxiliary gate under any condition.

In other words, α state at a low temperature (that is, the temperature of the multi-gate semiconductor device is lower than 75° C.) is defined as an α state. In addition, the condition that the turn-on switching current (current flowing when the multi-gate semiconductor device comes into the ON state) or the turn-off switching current (current flowing when the multi-gate semiconductor device comes into the OFF state) is less than ½ of the rated current A is defined as the β condition.

In this case, in the α state and the β condition, the gate electrode (first gate) having a lower threshold voltage is set as the main gate, and the gate electrode (second gate and third gate) having a higher threshold voltage is set as the auxiliary gate. Then, at the time of turn-on switching, the turn-on control signal is input from the auxiliary gate later by the "adjustment time TonL" than the time of turn-on switching (that is, temporally later), and at the time of turn-off switching, the turn-off control signal is input from the auxiliary gate earlier by the "adjustment time ToffL" than the time of turn-off switching (that is, temporally later). It should be noted that even when the β condition is not satisfied (that is, when only the α state is satisfied), a gate electrode (first gate) having a lower threshold voltage is set as the main gate, a gate electrode (second gate and third gate) having a higher threshold voltage is set as the auxiliary gate, a turn-on control signal can be input from the auxiliary gate later by the "adjustment time TonL" than the time of turn-on switching at the time of turn-on switching, and a turn-off control signal can be input from the auxiliary gate earlier by the "adjustment time ToffL" than the time of turn-off switching at the time of turn-off switching.

A state at a high temperature (that is, the temperature of the multi-gate semiconductor device is equal to or higher than 75° C.) is defined as the γ state. In addition, the condition that the turn-on switching current (current flowing when the multi-gate semiconductor device comes into the ON state) or the turn-off switching current (current flowing when the multi-gate semiconductor device comes into the OFF state) is equal to or larger than ½ of the rated current A is defined as the δ condition.

In this case, in the γ state or the β condition, the gate electrode (first gate and third gate) having a lower threshold voltage is set as the auxiliary gate, and the gate electrode (second gate) having a higher threshold voltage is set as the main gate. Then, at the time of turn-on switching, the turn-on control signal is input from the auxiliary gate earlier by the "adjustment time TonH" than the time of turn-on switching (that is, temporally earlier), and at the time of turn-off switching, the turn-off control signal is input from the auxiliary gate later by the "adjustment time ToffH" than the time of turn-off switching (that is, temporally later).

Although the third gate is used as the auxiliary gate in the above example, if the input timings of the turn-on control signals of the main gate and the third gate are substantially at the same time without shifting, EMI is sacrificed, but a loss at the time of turn-on switching can be reduced. In addition, if the input timings of the turn-off control signals of the main gate and the third gate are substantially at the same time without shifting, EMI is sacrificed, but a loss at the time of turn-off switching can be reduced. Therefore, it is desirable to adjust the input timing of the third gate in accordance with the operating condition of the apparatus to be applied.

Third Preferred Embodiment

A semiconductor device and a method for driving the semiconductor device according to the present preferred embodiment will be described. It should be noted that in the following description, the same components as those described in the preferred embodiment described above are denoted by the same reference numerals and illustrated, and the detailed description thereof will be appropriately omitted.

<Configuration of Semiconductor Device>

In the present preferred embodiment, an MG-IGBT will be described as an example of a multi-gate semiconductor device in which an auxiliary gate is provided on a second main surface (collector surface) of the structure illustrated in FIG. 2.

Figure 6:
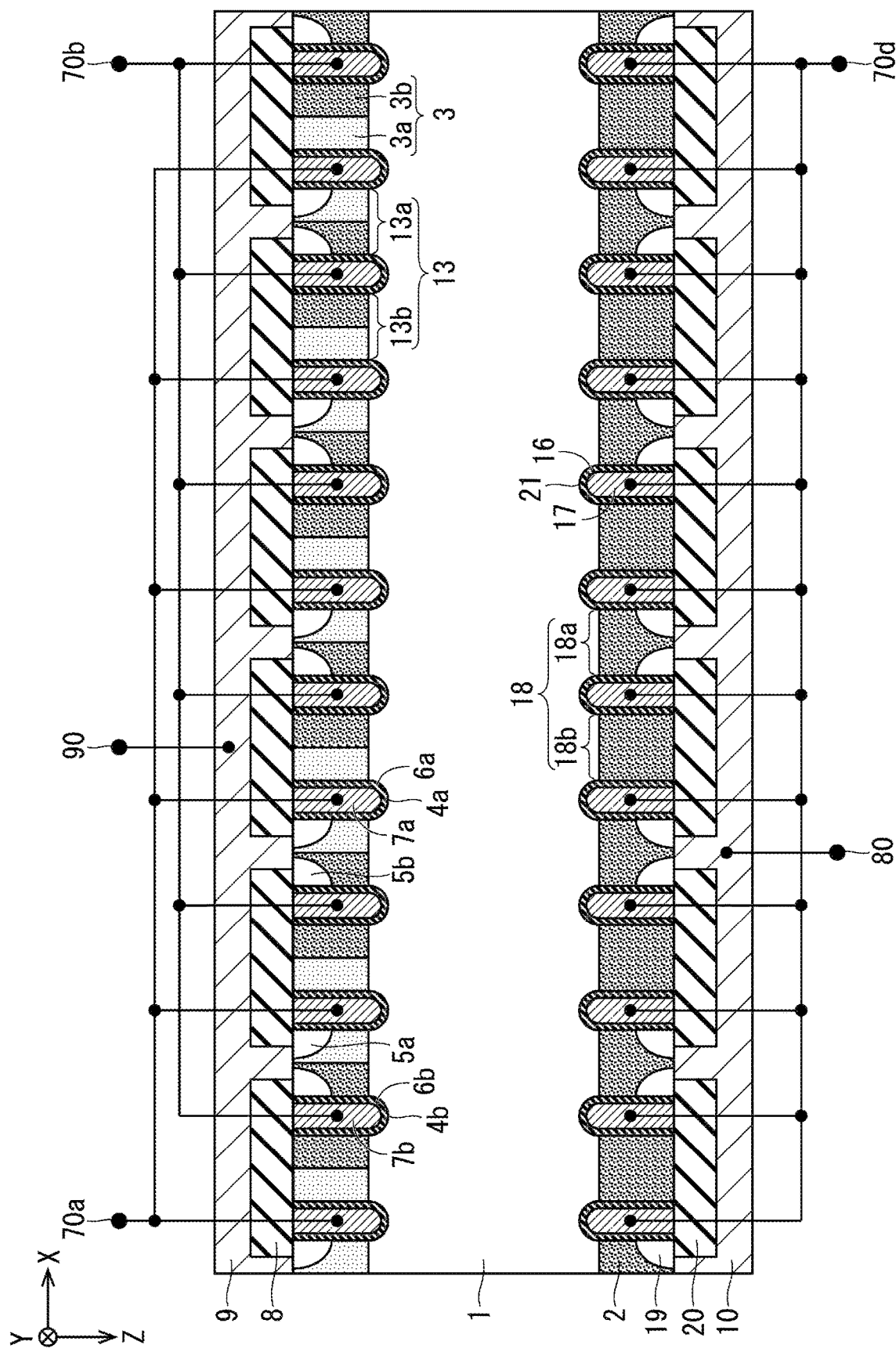
FIG. 6 is a cross-sectional view schematically showing a configuration example of the multi-gate semiconductor device according to the preferred embodiment.

FIG. 6 is a cross-sectional view schematically showing a configuration example of the multi-gate semiconductor device according to the present preferred embodiment.

As shown with an example in FIG. 6, the surface layer on the first main surface of the n-type base layer 1 is formed with a p-type base region 3a, a p-type base region 3b, a trench 4a, a trench 4b, a gate insulating film 6a, a gate insulating film 6b, a gate electrode 7a, a gate electrode 7b, an $n^+$-type emitter layer 5a, and an $n^+$-type emitter layer 5b. It should be noted that the gate electrode 7a is further connected to the gate terminal 70a. In addition, the gate electrode 7b is further connected to the gate terminal 70b.

The upper surface of the n-type base layer 1 is formed with an insulating film 8 and an emitter electrode 9. The emitter electrode 9 is further connected to the emitter terminal 90.

The surface layer on the second main surface (collector surface) of the n-type base layer 1 is formed with a p-type ($p^+$) collector region 2. It should be noted that an $n^+$-type buffer layer 1a for suppressing extension of a depletion layer may be provided between the $p^+$-type collector region 2 and the n-type base layer 1.

The $p^+$-type collector region 2 is selectively formed with a trench 21 that penetrates the $p^+$-type collector region 2 and further reaches the inside of the n-type base layer 1.

The bottom surface and the side surface in the trench 21 are formed with a gate insulating film 16. In addition, an inner region surrounded by the gate insulating film 16 in the trench 21 is filled with, for example, polysilicon having an impurity concentration of about $1 \times 10^{20}$ cm$^{-3}$, and a gate electrode 17 is formed. The gate electrode 17 is further connected to the gate terminal 70d.

The $p^+$-type collector region 2 sandwiched between the adjacent trenches 21 is also referred to as a mesa shape 18.

In addition, the surface layer in the p+-type collector region 2 is selectively formed with an n-type ($n^+$) collector layer 19 adjacent to a part of the side surface portion of the gate electrode 17.

Here, the mesa shape 18 in which the $n^+$-type collector layer 19 is formed is also referred to as a mesa 18a. In addition, the mesa shape 18 in which the $n^+$-type collector layer 19 is not formed is also referred to as a mesa 18b. The mesa 18a and the mesa 18b are alternately arranged in the X-axis positive direction in FIG. 6.

The $p^+$-type collector region 2 facing the gate electrode 17 (fourth gate) in the mesa 18a functions as a fourth channel formation region.

The lower surface of the n-type base layer 1 is partially formed with an insulating film 20. In addition, a collector electrode 10 is formed to cover the insulating film 20 and the lower surface (that is, a part of the lower surface of the mesa 18a) of the n-type base layer 1 exposed without being covered with the insulating film 20. The collector electrode 10 is further connected to the collector terminal 80.

On the lower surface of the mesa 18a, the $p^+$-type collector region 2 and the $n^+$-type collector layer 19 are electrically connected to the collector electrode 10.

On the other hand, since covered with the insulating film 20, the lower surfaces of the trench 21 and the mesa 18b are insulated and separated from the collector electrode 10.

In addition, on the lower surface of the n-type base layer 1, a gate pad insulated and separated from the collector electrode 10 is disposed to be connected to the gate terminal 70d.

The gate pad is made of an aluminum-based material. Then, the gate pad is electrically connected to the corresponding gate electrode 17 through the trench routing wiring line.

In the MG-IGBT configured as described above, the gate electrode 17 (fourth gate) is used as an auxiliary gate under any condition.

By forming a channel in the p+-type collector region 2 facing the gate electrode 17 (fourth gate), an electrical path from the n-type base layer 1 to the collector electrode 10 in the MG-IGBT is formed.

Therefore, carriers in the MG-IGBT can be adjusted not only from the first main surface (emitter surface) side of the n-type base layer 1 but also from the second main surface (collector surface) side of the n-type base layer 1.

Here, adjusting carriers inside the MG-IGBT from the first main surface (emitter surface) side of the n-type base layer 1 is effective for controlling carriers present on the first main surface side. In addition, adjusting carriers inside the MG-IGBT from the second main surface (collector surface) side of the n-type base layer 1 is effective for controlling carriers present on the second main surface side.

Therefore, by using the gate electrode 17 (fourth gate) as an auxiliary gate, it is possible to perform precise control with likelihood. That is, since the auxiliary gate on the second main surface (collector surface) is provided in addition to the auxiliary gate on the first main surface (emitter surface), the carrier density accumulated inside the IGBT can be controlled also from the second main surface (collector surface) side. As a result, the control time of the carrier density can be shortened, and the accuracy of the control can be improved, which is effective to reduce the loss or improve the accuracy of the waveform control.

It should be noted that in FIG. 6, the structure on the first main surface (emitter surface) is the structure shown in FIG. 2, but instead of the structure, the structure shown in FIG. 4 may be applied or the structure shown in FIG. 5 may be applied.

Fourth Preferred Embodiment

A power conversion apparatus and a method for manufacturing the power conversion apparatus according to the present preferred embodiment will be described. In the following description, the same components as those described in the preferred embodiments described above are denoted by the same reference numerals and illustrated, and the detailed description thereof will be appropriately omitted.

<Configuration of Power Conversion Apparatus>

The present preferred embodiment is obtained by applying the semiconductor device according to the above-described preferred embodiments to a power conversion apparatus. The power conversion apparatus to be applied is not limited to one for a specific use, but in the following, a case where the power conversion apparatus is applied to a three-phase inverter will be described.

Figure 7:
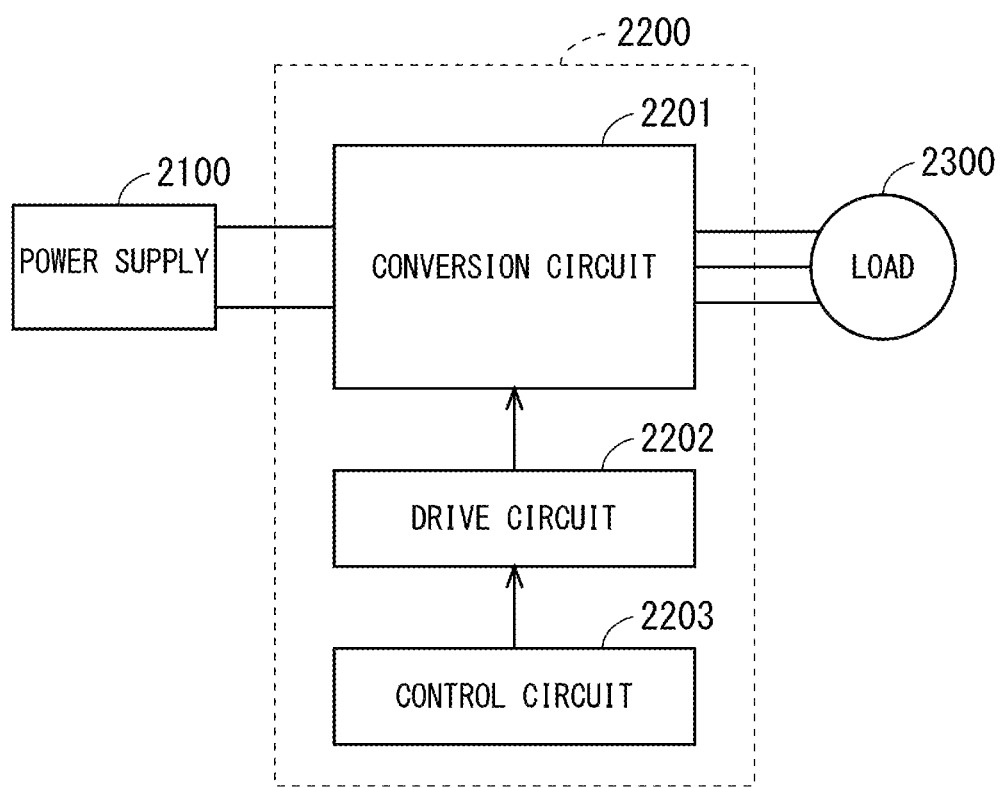
FIG. 7 is a diagram conceptually showing an example of the configuration of a power conversion system including a power conversion apparatus according to the present preferred embodiment.

FIG. 7 is a diagram conceptually showing an example of the configuration of a power conversion system including the power conversion apparatus according to the present preferred embodiment.

As shown with an example in FIG. 7, the power conversion system includes a power supply 2100, a power conversion apparatus 2200, and a load 2300. The power supply 2100 is a DC power supply, and supplies DC power to the power conversion apparatus 2200. The power supply 2100 can include various things, such as a DC system, a solar cell, a storage battery, or the like. In addition, the power supply 2100 can include a rectifier circuit connected to an AC system, an AC-DC converter, or the like. In addition, the power supply 2100 may include a DC-DC converter for converting DC power output from the DC system into predetermined power.

The power conversion apparatus 2200 is a three-phase inverter connected between the power supply 2100 and the load 2300. The power conversion apparatus 2200 converts the DC power supplied from the power supply 2100 into AC power, and further supplies the AC power to the load 2300.

In addition, as shown with an example in FIG. 7, the power conversion apparatus 2200 includes a conversion circuit 2201 for converting DC power into AC power to output the converted power, a drive circuit 2202 for outputting a drive signal for driving each switching element of the conversion circuit 2201, and a control circuit 2203 for outputting a control signal for controlling the drive circuit 2202 to the drive circuit 2202.

The load 2300 is a three-phase electric motor driven by AC power supplied from the power conversion apparatus 2200. It should be noted that the load 2300 is not limited to a specific use, and is an electric motor to be mounted on various electric apparatuses, and is used as, for example, a hybrid vehicle, an electric vehicle, a railway vehicle, an elevator, or an electric motor for an air conditioner.

Hereinafter, details of the power conversion apparatus 2200 will be described. The conversion circuit 2201 includes a switching element and a reflux diode (not shown here). Then, the switching element performs switching operation to convert the DC power supplied from the power supply 2100 into AC power, and further supplies the AC power to the load 2300.

There are various specific circuit configurations of the conversion circuit 2201, and the conversion circuit 2201 according to the present preferred embodiment is a two-level three-phase full bridge circuit and includes six switching elements and six reflux diodes connected antiparallel to the respective switching elements.

The semiconductor device according to any one of the above-described preferred embodiments is applied to at least one of each switching element and each reflux diode in the conversion circuit 2201. The six switching elements are connected in series for every two switching elements to constitute upper and lower arms, and the respective upper and lower arms constitute each phase (that is, U phase, V phase, and W phase) of the full bridge circuit. Then, the output terminals of the respective upper and lower arms (that is, the three output terminals of the conversion circuit 2201) are connected to the load 2300.

The drive circuit 2202 generates drive signals for driving the switching elements of the conversion circuit 2201, and further supplies the drive signals to the control electrodes of the switching elements of the conversion circuit 2201. Specifically, based on a control signal output from a control circuit 2203 described below, a drive signal to turn the switching element into the ON state and a drive signal to turn the switching element into the OFF state are output to the control electrodes of the respective switching elements.

When the switching element is maintained in the ON state, the drive signal is a voltage signal equal to or more than the threshold voltage of the switching element (that is, ON signal), and when the switching element is maintained in the OFF state, the drive signal is a voltage signal equal to or less than the threshold voltage of the switching element (that is, OFF signal).

The control circuit 2203 controls the switching elements of the conversion circuit 2201 so that desired power is supplied to the load 2300. Specifically, based on the power to be supplied to the load 2300, the time required for each switching element of the conversion circuit 2201 to be in the ON state (that is, ON time) is calculated. For example, the PWM control for modulating the ON time of the switching element according to the voltage to be output can control the conversion circuit 2201.

Then, the control circuit 2203 outputs a control instruction (that is, control signal) to the drive circuit 2202 so that, at each time point, the ON signal is output to the switching element to be turned on and the OFF signal is output to the switching element to be turned off. The drive circuit 2202 outputs an ON signal or an OFF signal as a drive signal to the control electrode of each switching element based on the control signal.

In the power conversion apparatus 2200 according to the present preferred embodiment, since the semiconductor device according to any one of the preferred embodiments described above is applied as the switching element of the conversion circuit 2201, it is possible to stabilize the ON-resistance after going through the energization cycle.

It should be noted that in the present preferred embodiment, an example in which the semiconductor device according to any one of the preferred embodiments described above is applied to a two-level three-phase inverter has been described, but the application example is not limited to this. The semiconductor device according to any of the above-described preferred embodiments can be applied to various power conversion apparatuses.

In addition, although a two-level power conversion apparatus has been described in the present preferred embodiment, the semiconductor device according to any one of the above-described preferred embodiments may be applied to a three-level or multi-level power conversion apparatus. In addition, when power is supplied to a single-phase load, the semiconductor device according to any one of the preferred embodiments described above may be applied to a single-phase inverter.

In addition, when power is supplied to a DC load or the like, the semiconductor device according to any one of the preferred embodiments described above can also be applied to the DC-DC converter or the AC-DC converter.

In addition, the power conversion apparatus to which the semiconductor device according to any one of the above-described preferred embodiments is applied is not limited to the case where the load described above is an electric motor, and can also be used as a power supply apparatus for, for example, an electric discharge machine, a laser beam machine, an induction heating cooker, or a noncontact power feeding system. In addition, the power conversion apparatus to which the semiconductor device according to any one of the above-described preferred embodiments is applied can also be used as a power conditioner in a solar power generation system, a power storage system, or the like.

<Method for Manufacturing Power Conversion Apparatus>

Next, a method for manufacturing the power conversion apparatus according to the present preferred embodiment will be described.

First, a semiconductor device is manufactured by the manufacturing method described in the preferred embodiments described above. Then, the conversion circuit 2201 including the semiconductor device is provided as a configuration of the power conversion apparatus. The conversion circuit 2201 is a circuit for converting and outputting input power.

Then, a drive circuit 2202 is provided as a configuration of the power conversion apparatus. The drive circuit 2202 is a circuit for outputting a drive signal for driving the semiconductor device to the semiconductor device. Then, a control circuit 2203 is provided as a configuration of the power conversion apparatus. The control circuit 2203 is a circuit for outputting a control signal for controlling the drive circuit 2202 to the drive circuit 2202.

The semiconductor switching element used in the preferred embodiments described above is not limited to a switching element made of a silicon (Si) semiconductor, and for example, the semiconductor switching element may be made of a non-Si semiconductor material having a wider band gap than a Si semiconductor.

Examples of the wide band gap semiconductor being a non-Si semiconductor material include silicon carbide, a gallium nitride-based material, and diamond.

A switching element made of a wide band gap semiconductor can be used even in a high voltage region where unipolar operation is difficult with a Si semiconductor, and a switching loss generated at the time of switching operation can be greatly reduced. Therefore, the power loss can be greatly reduced.

In addition, a switching element made of a wide band gap semiconductor has a small power loss and high heat resistance. Therefore, when a power module including a cooling unit is configured, the heat dissipation fin of the heat sink can be reduced in size, so that the semiconductor module can be further reduced in size.

In addition, a switching element made of a wide bandgap semiconductor is suitable for high-frequency switching operation. Therefore, when the switching element made of a wide bandgap semiconductor is applied to a converter circuit in which there is a large demand for higher frequency, a reactor, a capacitor, or the like to be connected to the converter circuit can also be reduced in size by increasing the switching frequency. Therefore, the semiconductor switching element according to the preferred embodiments described above can obtain similar effects even when the semiconductor switching element is a switching element made of a wide-gap semiconductor such as silicon carbide.

Effects Produced by Preferred Embodiments Described Above

Next, examples of effects produced by the above-described preferred embodiments will be shown. It should be noted that in the following description, the effects are described based on the specific configuration exemplified in the above-described preferred embodiments, but in the scope where the same effects are produced, the configuration may be replaced with other specific configurations exemplified in the specification of the present application. That is, in the following description, for convenience, only one of the associated specific configurations may be described as a representative, but the specific configuration described as a representative may be replaced with associated another specific configuration.

In addition, the replacement may be performed across a plurality of preferred embodiments. That is, the case may be used where the same effects are produced by combining the respective configurations exemplified in different preferred embodiments.

According to the preferred embodiments described above, a semiconductor device includes a layer structure, and a first main electrode and a second main electrode conductive through the layer structure. Here, the first main electrode corresponds to, for example, the emitter electrode 9. In addition, the second main electrode corresponds to, for example, the collector electrode 10. The layer structure includes a first semiconductor layer of a first conductivity type, a first semiconductor region of a second conductivity type, a second semiconductor region of a second conductivity type, a second semiconductor layer of a first conductivity type, a first gate insulating film, a second gate insulating film, a first gate electrode, and a second gate electrode. Here, the first semiconductor layer of the first conductivity type corresponds to, for example, at least one of the n-type base layer 1, the n-type semiconductor substrate 30, or the like. In addition, the first semiconductor region of the second conductivity type corresponds to, for example, at least one of the p-type base region $3a$, the p-type base region $3c$, the p-type base region $3e$, and the like. In addition, the second semiconductor region of the second conductivity type corresponds to, for example, at least one of the p-type base region $3b$, the p-type base region $3d$, the p-type base region $3f$, and the like. In addition, the second semiconductor layer of the first conductivity type corresponds to, for example, at least one of an $n^+$-type emitter layer 5a, an $n^+$-type emitter layer 5b, an $n^+$-type emitter layer 5c, an $n^+$-type emitter layer 5d, an $n^+$-type emitter layer 5e, an $n^+$-type emitter layer 5f, an $n^+$-type emitter layer 5g, and the like. In addition, the first gate insulating film corresponds to, for example, the gate insulating film 6a. In addition, the second gate insulating film corresponds to, for example, the gate insulating film 6b. In addition, the first gate electrode corresponds to, for example, the gate electrode 7a. In addition, the second gate electrode corresponds to, for example, the gate electrode 7b.

The n-type base layer 1 has a first surface and a second surface opposite to the first surface. The p-type base region 3a is partially provided in the surface layer on the first surface. The p-type base region 3b is partially provided in the surface layer on the first surface. The n⁺-type emitter layer 5a is partially provided in the surface layer in the p-type base region 3a. The n⁺-type emitter layer 5b is partially provided in the surface layer in the p-type base region 3b. The gate insulating film 6a is provided in contact with the p-type base region 3a (or, the p-type base region 3e) sandwiched between the n-type base layer 1 and the n⁺-type emitter layer 5a (or, the n⁺-type emitter layer 5e). The gate insulating film 6b is provided in contact with the p-type base region 3b (or, the p-type base region 30 sandwiched between the n-type base layer 1 and the n⁺-type emitter layer 5b (or, the n⁺-type emitter layer 50. The gate electrode 7a is a gate electrode provided in contact with the gate insulating film 6a. The gate electrode 7b is a gate electrode provided in contact with the gate insulating film 6b. Applying a voltage to the gate electrode 7a or the gate electrode 7b makes it possible to switch between an ON state in which the emitter electrode 9 and the collector electrode 10 are conducting through the layer structure and an OFF state in which the emitter electrode 9 and the collector electrode 10 are not conducting through the layer structure. The threshold voltage of the gate electrode 7b is higher than the threshold voltage of the gate electrode 7a. Here, α state in which the temperature of the layer structure is lower than the threshold temperature is defined as an α state. In addition, a condition that the switching current, which is a current value at the time of the switching operation for switching to the ON state or the OFF state, is less than the threshold current is defined as a β condition. In addition, α state in which the temperature of the layer structure is equal to or higher than the threshold temperature is defined as a γ state. In addition, a condition that the switching current is equal to or larger than the threshold current is defined as a δ condition. In the α state and the β condition, the switching operation is performed using the gate electrode 7a. In the γ state or the δ condition, the switching operation is performed using the gate electrode 7b.

According to this configuration, even when the threshold voltage of the gate electrode fluctuates with the change in the operating temperature, occurrence of malfunction of the semiconductor device can be effectively suppressed by selectively using a plurality of gate electrodes having different threshold voltages according to the operating temperature.

It should be noted that even when another configuration exemplified in the specification of the present application is appropriately added to the above configuration, that is, even when another configuration in the specification of the present application not referred to as the above configuration is appropriately added, a similar effect can be produced.

It should be noted that by performing control so that the voltage value applied to the main gate and the voltage value applied to the auxiliary gate are different from each other, it is also possible to produce the same effects as described above, but a circuit or the like for controlling a plurality of gate voltages is separately required, and the manufacturing cost also increases.

In addition, according to the preferred embodiments described above, the threshold temperature is 75° C. According to this configuration, even when the operating temperature fluctuates in the temperature range of room temperature (25° C.) to 125° C., occurrence of malfunction of the semiconductor device can be effectively suppressed by selectively using the plurality of gate electrodes having different threshold voltages according to the operating temperature.

In addition, according to the preferred embodiments described above, the threshold current is ½ of the rated current. According to this configuration, even when the operating temperature fluctuates in the temperature range of room temperature (25° C.) to 125° C. due to the influence of the rated current, occurrence of malfunction of the semiconductor device can be effectively suppressed by selectively using the plurality of gate electrodes having different threshold voltages according to the operating temperature.

In addition, according to the preferred embodiments described above, the semiconductor device includes the third semiconductor region of the second conductivity type, the third semiconductor layer of the first conductivity type, the third gate insulating film, and the third gate electrode. Here, the third semiconductor region corresponds to, for example, the p⁺-type collector region 2. In addition, the third semiconductor layer corresponds to, for example, the n⁺-type collector layer 19. In addition, the third gate insulating film corresponds to, for example, the gate insulating film 16. In addition, the third gate electrode corresponds to, for example, the gate electrode 17. The p⁺-type collector region 2 is partially provided in the surface layer on the second surface. The n⁺-type collector layer 19 is partially provided in the surface layer in the p⁺-type collector region 2. The gate insulating film 16 is provided in contact with the p⁺-type collector region 2 sandwiched between the n-type base layer 1 and the n⁺-type collector layer 19. The gate electrode 17 is a gate electrode formed in contact with the gate insulating film 16. According to this configuration, by combining not only the plurality of gates on the first main surface but also the gates on the second main surface, the carrier density accumulated inside the IGBT can be controlled also from the second main surface (collector surface) side. As a result, the control time of the carrier density can be shortened, and the accuracy of the control can be improved, which is effective to reduce the loss or improve the accuracy of the waveform control.

In addition, according to the preferred embodiments described above, the impurity concentration of the p-type base region 3b is higher than the impurity concentration of the p-type base region 3a. According to this configuration, the threshold voltage of the gate electrode 7b (second gate) can be made higher than the threshold voltage of the gate electrode 7a (first gate).

In addition, according to the preferred embodiments described above, the thickness of the gate insulating film 6b is larger than the thickness of the gate insulating film 6a. According to this configuration, the threshold voltage of the gate electrode 7b (second gate) can be made higher than the threshold voltage of the gate electrode 7a (first gate).

In addition, according to the preferred embodiments described above, the dielectric constant of the gate insulating film 6b serving as the channel is lower than the dielectric constant of the gate insulating film 6a serving as the channel. According to this configuration, the threshold voltage of the gate electrode 7b (second gate) can be made higher than the threshold voltage of the gate electrode 7a (first gate).

In addition, according to the preferred embodiments described above, the gate length of the gate electrode 7b is larger than the gate length of the gate electrode 7a. According to this configuration, the threshold voltage of the gate electrode 7b (second gate) can be made higher than the threshold voltage of the gate electrode 7a (first gate).

In addition, according to the preferred embodiments described above, the threshold voltage of the gate electrode 7b is higher than the threshold voltage of the gate electrode 7a by 10% or more. According to this configuration, even when the threshold voltage fluctuates with a change in the operating temperature, it is possible to prevent the threshold voltage from becoming equal to or lower than the threshold voltage of the gate electrode at a low temperature. Therefore, it is possible to suppress occurrence of malfunction caused by the external noise voltage.

In addition, according to the preferred embodiments described above, the semiconductor device includes the fourth semiconductor region of the second conductivity type, the fourth gate insulating film, and the fourth gate electrode. Here, the fourth semiconductor region corresponds to, for example, the p-type base region 3g. In addition, the fourth gate insulating film corresponds to, for example, the gate insulating film 6c. In addition, the fourth gate electrode corresponds to, for example, the gate electrode 7c. The p-type base region 3g is partially provided in the surface layer on the first surface. The n+-type emitter layer 5g is also partially provided in the surface layer in the p-type base region 3g. The gate insulating film 6c is provided in contact with the p-type base region 3g sandwiched between the n-type base layer 1 and the n$^+$-type emitter layer 5g. The gate electrode 7c is a gate electrode provided in contact with the gate insulating film 6c. The threshold voltage of the gate electrode 7c is equal to or higher than the threshold voltage of the gate electrode 7a. According to this configuration, it is possible to precisely control the switching waveform (specifically, precise control of $dI_{on}/dt$ or $dV_{off}/dt$) and to secure the likelihood of waveform adjustment.

In addition, according to the preferred embodiments described above, the threshold voltage of the gate electrode 7c is equal to or lower than the threshold voltage of the gate electrode 7b. According to this configuration, it is possible to precisely control the switching waveform (specifically, precise control of $dI_{on}/dt$ or $dV_{off}/dt$) and to secure the likelihood of waveform adjustment.

In addition, according to the preferred embodiments described above, after the switching operation for switching to the ON state is performed, the voltage applied to the gate electrode not used for the switching operation is switched. According to such a configuration, it is possible to suppress an increase in $dI_{on}/dt$ during the turn-on switching due to the surge current during the turn-on switching, and thus, it is possible to reduce the turn-on loss.

In addition, according to the preferred embodiments described above, the power conversion apparatus includes the conversion circuit 2201 that includes the semiconductor device and converts and outputs the input power, the drive circuit 2202 that outputs a drive signal for driving the semiconductor device to the semiconductor device, and the control circuit 2203 that outputs a control signal for controlling the drive circuit 2202 to the drive circuit 2202. According to this configuration, even when the threshold voltage of the gate electrode fluctuates with the change in the operating temperature, occurrence of malfunction of the semiconductor device and further malfunction of the power conversion apparatus can be effectively suppressed by selectively using a plurality of gate electrodes having different threshold voltages according to the operating temperature.

According to the preferred embodiments described above, in a method for driving a semiconductor device, the semiconductor device includes a layer structure, and an emitter electrode 9 and a collector electrode 10 that are conductive through the layer structure. The layer structure includes an n-type base layer 1 having a first surface and a second surface opposite the first surface, a p-type base region 3a partially provided in a surface layer on the first surface, a p-type base region 3b partially provided in a surface layer on the first surface, an n$^+$-type emitter layer 5a partially provided in a surface layer in the p-type base region 3a and in a surface layer in the p-type base region 3b, a gate insulating film 6a provided in contact with the p-type base region 3a sandwiched between the n-type base layer 1 and the second semiconductor layer, a gate insulating film 6b provided in contact with the p-type base region 3b sandwiched between the n-type base layer 1 and the second semiconductor layer, a gate electrode 7a being a gate electrode provided in contact with the gate insulating film 6a, and a gate electrode 7b being a gate electrode provided in contact with the gate insulating film 6b. Then, applying a voltage to the gate electrode 7a or the gate electrode 7b makes it possible to switch between an ON state in which the emitter electrode 9 and the collector electrode 10 are conducting through the layer structure and an OFF state in which the emitter electrode 9 and the collector electrode 10 are not conducting through the layer structure. In addition, the threshold voltage of the gate electrode 7b is higher than the threshold voltage of the gate electrode 7a. Here, α state in which the temperature of the layer structure is lower than the threshold temperature is defined as an α state. In addition, a condition that the switching current, which is a current value at the time of the switching operation for switching to the ON state or the OFF state, is less than the threshold current is defined as a β condition. In addition, α state in which the temperature of the layer structure is equal to or higher than the threshold temperature is defined as a γ state. In addition, a condition that the switching current is equal to or larger than the threshold current is defined as a δ condition. In the α state and the β condition, the switching operation is performed using the gate electrode 7a. In addition, in the γ state or the δ condition, the switching operation is performed using the gate electrode 7b. Then, in the method for driving the semiconductor device, before the switching operation for switching to the OFF state is performed, the voltage applied to the gate electrode not used for the switching operation is switched.

According to this configuration, even when the threshold voltage of the gate electrode fluctuates with the change in the operating temperature, occurrence of malfunction of the semiconductor device can be effectively suppressed by selectively using a plurality of gate electrodes having different threshold voltages according to the operating temperature. In addition, since an increase in $dI_{on}/dt$ or $dV_{off}/dt$ can be suppressed, the turn-off loss can be reduced.

It should be noted that when there is no particular limitation, the order in which each piece of treatment is performed can be changed.

In addition, even when another configuration exemplified in the specification of the present application is appropriately added to the above configuration, that is, even when another configuration in the specification of the present application not referred to as the above configuration is appropriately added, a similar effect can be produced.

In addition, according to the preferred embodiments described above, in the method for driving a semiconductor device, the semiconductor device includes a p$^+$-type collector region 2 partially provided in a surface layer on the second surface, an n$^+$-type collector layer 19 partially provided in a surface layer in the p$^+$-type collector region 2, a gate insulating film 16 provided in contact with the p$^+$-type collector region 2 sandwiched between the n-type base layer 1 and the n+-type collector layer 19, and a gate electrode 17 being a gate electrode formed in contact with the gate insulating film 16. According to this configuration, by combining not only the plurality of gates on the first main surface but also the gates on the second main surface, the carrier density accumulated inside the IGBT can be controlled also from the second main surface (collector surface) side. As a result, the control time of the carrier density can be shortened, and the accuracy of the control can be improved, which is effective to reduce the loss or improve the accuracy of the waveform control.

Modifications of Preferred Embodiments Described Above

In the preferred embodiments described above, a semiconductor device having an enhancement n-channel MOSFET structure has been described, but a semiconductor device having a depression channel MOSFET structure can also be applied.

In addition, although the IGBT is shown as an example of the multi-gate semiconductor device, a MOSFET is also applicable.

In addition, the minimum necessary number of gates of the multi-gate semiconductor device is two, and two or more gates can be applied.

In addition, in the preferred embodiments described above, what is called a vertical MOSFET has been described, but a case of being applied to a horizontal MOSFET can also be assumed.

In addition, in the preferred embodiments described above, a trench semiconductor device has been described, but it is also assumed that the present invention is applied to a planar semiconductor device having no trench.

In the preferred embodiments described above, quality of material, material, dimensions, shape, relative arrangement relationship, or condition of implementation of each component may be described, but these are one example in all aspects, and the present invention is assumed not to be limited to those described in the preferred embodiments.

Therefore, innumerable modifications not exemplified and their equivalents are assumed within the scope of the techniques disclosed in the specification of the present application. For example, a case of deforming, adding, or omitting at least one component, and furthermore, a case of extracting at least one component in at least one preferred embodiment to combine the extracted component with a component in another preferred embodiment are assumed to be included.

In addition, in the preferred embodiments described above, when a material name or the like is described without being particularly designated, as long as no contradiction arises, the material is assumed to include a material that contains other additives, such as an alloy.

In addition, as long as no contradiction arises, when it is described in the above-described preferred embodiments that "one" component is provided, "one or more" components may be provided.

Furthermore, each component in the preferred embodiments described above is a conceptual unit, and the scope of the technology disclosed in the specification of the present application is assumed to include a case where one component includes a plurality of structures, a case where one component corresponds to part of a structure, and furthermore, a case where a plurality of components are included in one structure.

In addition, each component in the preferred embodiments described above is assumed to include structures having other structures or shapes as long as the same function is exhibited.

In addition, the description in the specification of the present application is referred to for all purposes related to the present techniques, and none are assumed to be conventional techniques.

In addition, in the preferred embodiments described above, it has been described that the first conductivity type is n-type and the second conductivity type is p-type, but conversely, the first conductivity type may be p-type and the second conductivity type may be n-type.

While the disclosure has been shown and described in detail, the foregoing description is in all aspects illustrative and not restrictive. It is therefore understood that numerous modifications and variations can be devised.

What is claimed is:

1. A semiconductor device comprising:
a layer structure; and
a first main electrode and a second main electrode configured to be conducting through the layer structure,
wherein the layer structure includes:
a first semiconductor layer of a first conductivity type having a first surface and a second surface opposite the first surface;
a first semiconductor region of a second conductivity type partially in a surface layer on the first surface;
a second semiconductor region of a second conductivity type partially in a surface layer on the first surface;
a second semiconductor layer of a first conductivity type partially in a surface layer in the first semiconductor region and a surface layer in the second semiconductor region;
a first gate insulating film in contact with the first semiconductor region sandwiched between the first semiconductor layer and the second semiconductor layer;
a second gate insulating film in contact with the second semiconductor region sandwiched between the first semiconductor layer and the second semiconductor layer;
a first gate electrode being a gate electrode in contact with the first gate insulating film; and
a second gate electrode being the gate electrode in contact with the second gate insulating film,
wherein
the semiconductor device is configured to, upon applying a voltage to the first gate electrode or the second gate electrode, switch between an ON state in which the first main electrode and the second main electrode are conducting through the layer structure and an OFF state in which the first main electrode and the second main electrode are not conducting through the layer structure,
a threshold voltage of the second gate electrode is higher than a threshold voltage of the first gate electrode,
α state in which a temperature of the layer structure is lower than a threshold temperature is defined as an α state,
α state in which a temperature of the layer structure is equal to or higher than a threshold temperature is defined as a γ state,
in the α state, a switching operation of switching to the ON state or the OFF state is performed using the first gate electrode,
in the γ state, the switching operation is performed using the second gate electrode, a condition that a switching current is less than a threshold current is defined as a β condition, the switching current being a current value during the switching operation, a condition that the switching current is equal to or larger than a threshold current is defined as a δ condition, the semiconductor device is configured to perform the switching operation using the first gate electrode only when in the α state and the β condition, and the semiconductor device is configured to perform the switching operation using the second gate electrode, in the γ state or the δ condition.

2. The semiconductor device according to claim 1, wherein
a rated current is a current that flows through the semiconductor device; and
the threshold current is ½ of the rated current.

3. The semiconductor device according to claim 1, wherein the threshold temperature is 75° C.

4. The semiconductor device according to claim 1, further comprising:
a third semiconductor region of a second conductivity type partially in a surface layer on the second surface;
a third semiconductor layer of a first conductivity type partially in a surface layer in the third semiconductor region;
a third gate insulating film in contact with the third semiconductor region sandwiched between the first semiconductor layer and the third semiconductor layer; and
a third gate electrode being the gate electrode in contact with the third gate insulating film.

5. The semiconductor device according to claim 1, wherein an impurity concentration in the second semiconductor region is higher than an impurity concentration in the first semiconductor region.

6. The semiconductor device according to claim 1, wherein a thickness of the second gate insulating film is larger than a thickness of the first gate insulating film.

7. The semiconductor device according to claim 1, wherein a dielectric constant of the second gate insulating film serving as a channel is lower than a dielectric constant of the first gate insulating film serving as a channel.

8. The semiconductor device according to claim 1, wherein a gate length of the second gate electrode is larger than a gate length of the first gate electrode.

9. The semiconductor device according to claim 1, wherein a threshold voltage of the second gate electrode is higher, by 10% or more, than a threshold voltage of the first gate electrode.

10. The semiconductor device according to claim 1, further comprising a fourth semiconductor region of a second conductivity type partially in a surface layer on the first surface,
wherein the second semiconductor layer is also partially in a surface layer in the fourth semiconductor region,
the semiconductor device further comprising:
a fourth gate insulating film in contact with the fourth semiconductor region sandwiched between the first semiconductor layer and the second semiconductor layer; and
a fourth gate electrode being the gate electrode in contact with the fourth gate insulating film,
wherein a threshold voltage of the fourth gate electrode is equal to or higher than a threshold voltage of the first gate electrode.

11. The semiconductor device according to claim 10, wherein a threshold voltage of the fourth gate electrode is equal to or less than a threshold voltage of the second gate electrode.

12. The semiconductor device according to claim 1, wherein after the semiconductor device performs the switching operation for switching to the ON-state, the semiconductor device is configured to switch a voltage applied to the gate electrode not used for the switching operation.

13. A power conversion apparatus comprising:
a conversion circuit including the semiconductor device according to claim 1, the conversion circuit configured to convert and output input power;
a drive circuit configured to output a drive signal for driving the semiconductor device; and
a control circuit configured to output a control signal for controlling the drive circuit.

* * * * *